United States Patent
Ker et al.

(10) Patent No.: US 6,838,734 B2
(45) Date of Patent: Jan. 4, 2005

(54) ESD IMPLANTATION IN DEEP-SUBMICRON CMOS TECHNOLOGY FOR HIGH-VOLTAGE-TOLERANT APPLICATIONS

(75) Inventors: Ming-Dou Ker, Hsinchu (TW); Tung-Yang Chen, Hsinchu (TW); Hun-Hsien Chang, Shijr (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/323,422

(22) Filed: Dec. 19, 2002

(65) Prior Publication Data

US 2003/0089951 A1 May 15, 2003

Related U.S. Application Data

(62) Division of application No. 09/970,825, filed on Oct. 5, 2001, now Pat. No. 6,514,839.

(51) Int. Cl.$^7$ .............................................. H01L 21/336
(52) U.S. Cl. ........................ 257/360; 257/369; 257/355
(58) Field of Search ................................. 257/355, 362,
257/360, 412, 368, 401, 409, 363, 365,
358, 315, 379, 510, 413, 336, 337, 408,
369; 438/795, 682, 200, 275, 197, 299,
306, 649, 229, 514, 301, 305, 199

(56) References Cited

U.S. PATENT DOCUMENTS

| | | | |
|---|---|---|---|
| 5,374,565 A | 12/1994 | Hsue et al. | .................... 437/30 |
| 5,416,036 A | 5/1995 | Hsue | ........................... 437/51 |
| 5,455,444 A | 10/1995 | Hsue | ........................... 257/413 |
| 5,496,751 A | * 3/1996 | Wei et al. | ................... 438/302 |
| 5,529,941 A | 6/1996 | Huang | ........................... 437/44 |
| 5,581,104 A | 12/1996 | Lowrey et al. | ............. 257/355 |

(List continued on next page.)

OTHER PUBLICATIONS

Stephen G. Beebe, "Methodology for Layout Design and Optimization of ESD Protection Transistors," EOS/ESD Symposium 96–265 to 96–275, pp. 6.1.1–6.1.11.
S. Daniel and G. Krieger, "Process and Design Optimization for Advanced CMOS I/O ESD Protection Devices," 1990 EOS/ESD Symposium Proceedings, pp. 206–213.

*Primary Examiner*—Carl Whitehead, Jr.
*Assistant Examiner*—Laura M Schillinger

(57) ABSTRACT

High-voltage-tolerant ESD protection devices (ESDPD) for deep-submicron CMOS process were activated between LDD implanting and forming sidewall spacers. ESD-Implant (ESDI) regions are located at the ESDPD, without covering the center region under the drain contact (DC). The ESDI LDD concentration and doping profile are deep to contain drain diffusion. Regions with the ESDI have a high junction breakdown voltage (JBV) and a low junction capacitance. After forming gate sidewall spacers, high doping concentration ions implanted into active D/S regions formed a shallower doping profile of the D/S diffusion. The drain has a JBV as without this ESDI, so the ESD current (ESDC) is discharged through the center junction region under the DC to bulk, far from the ESDPD surface channel region. The ESDPD sustains a high ESD level. In an original drain JBV of an MOS this ESDI method is unchanged, i.e. the same as that having no such ESDI, so it can be used in I/O circuits with high-voltage signals in the deep-submicron CMOS. The ESD level of the IO ESDPD improves. The ESD discharge current path in the MOS device structure improves the ESD level in the output buffer MOS. ESDI regions are located at the output MOS devices, without covering the region under the DC. Regions under the DC without this ESDI have an unchanged JBV, so the ESDC discharges through the junction region under the DC to bulk. The original drain JBV of the output MOS with this ESDI method is unchanged, which is still the same as that having no such ESDI, to be used in the I/O circuits with high-voltage (5V) input signals in the deep-submicron CMOS with 3.3V or 2.5V VDD. This applies to diodes, FOD and lateral BJT devices.

12 Claims, 38 Drawing Sheets

U.S. PATENT DOCUMENTS

| | | | | |
|---|---|---|---|---|
| 5,585,299 A | * | 12/1996 | Hsu | 438/275 |
| 5,631,485 A | * | 5/1997 | Wei et al. | 257/344 |
| 5,672,527 A | | 9/1997 | Lee | 437/41 RLD |
| 5,674,761 A | | 10/1997 | Chang et al. | 437/29 |
| 5,733,794 A | | 3/1998 | Gilbert et al. | 437/45 |
| 5,953,601 A | * | 9/1999 | Shiue et al. | 438/200 |
| 5,970,384 A | * | 10/1999 | Yamazaki et al. | 438/795 |
| 6,051,458 A | * | 4/2000 | Liang et al. | 438/224 |
| 6,063,706 A | * | 5/2000 | Wu | 438/682 |
| 6,069,031 A | * | 5/2000 | Wu | 438/197 |
| 6,187,619 B1 | * | 2/2001 | Wu | 438/224 |
| 6,355,962 B1 | * | 3/2002 | Liang et al. | 257/369 |
| 6,444,404 B1 | * | 9/2002 | Chen et al. | 430/314 |
| 6,479,872 B1 | * | 11/2002 | Cheng et al. | 257/360 |
| 6,514,839 B1 | * | 2/2003 | Ker et al. | 438/514 |
| 6,576,958 B2 | * | 6/2003 | Ker et al. | 257/355 |
| 6,590,264 B2 | * | 7/2003 | Ker et al. | 257/355 |

* cited by examiner

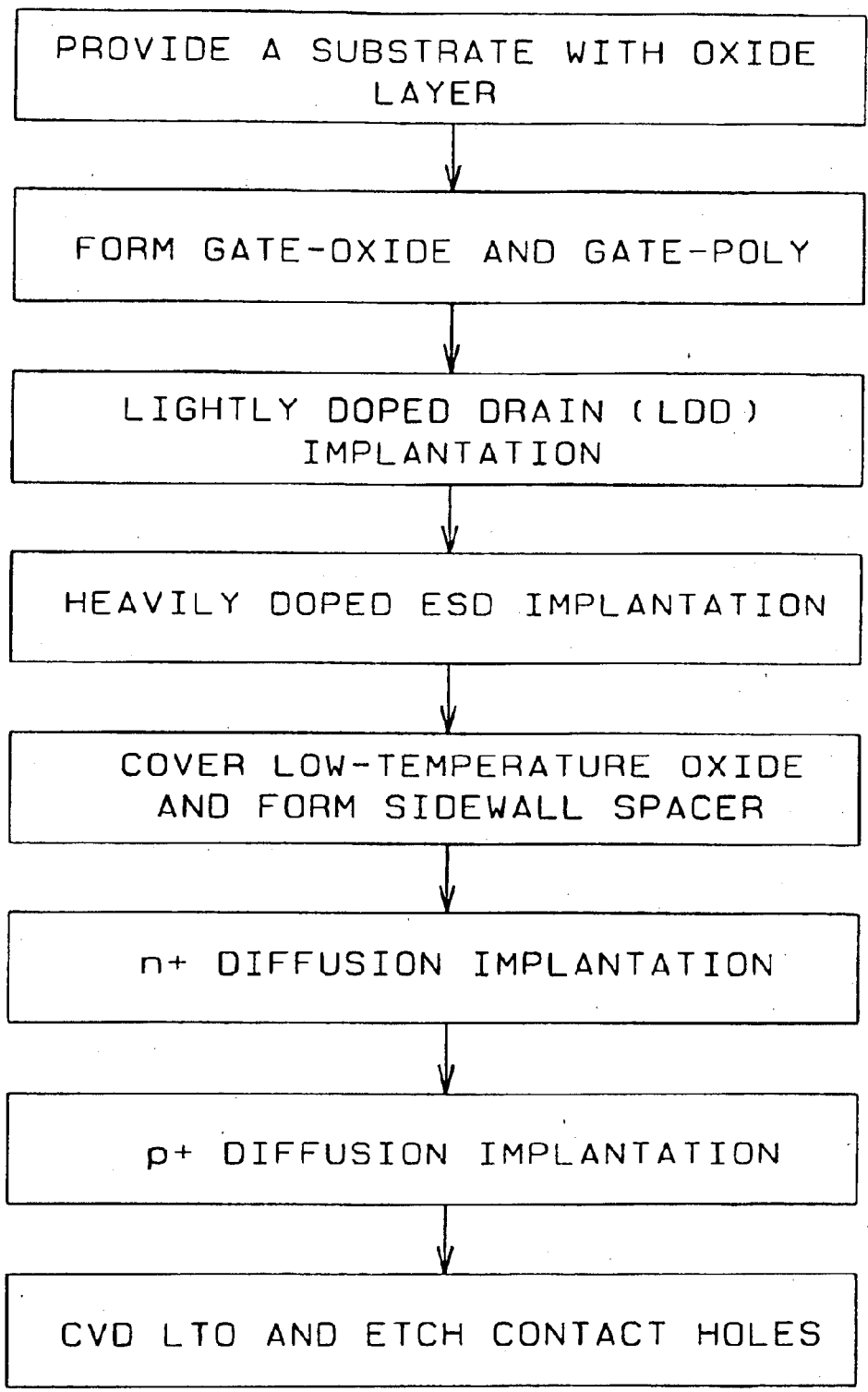
FIG. 1 — Prior Art

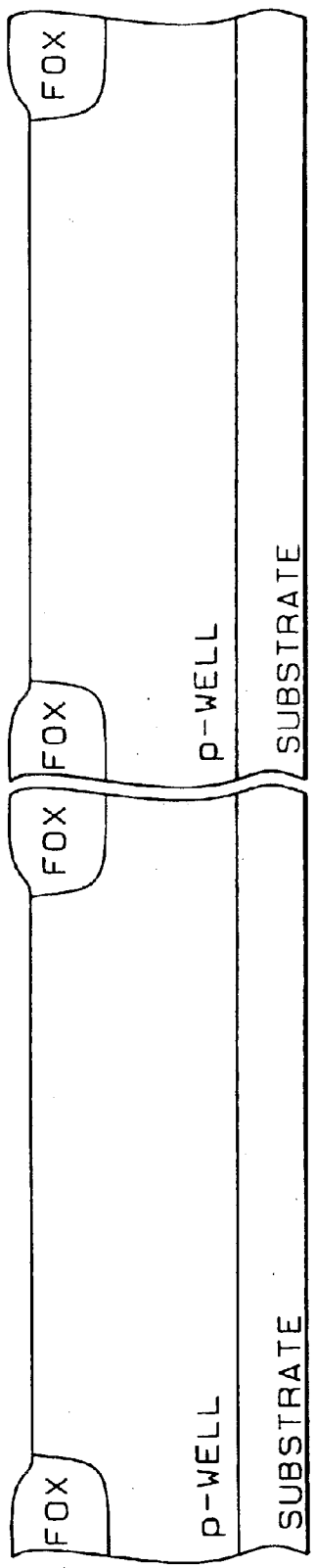
FIG. 2A – Prior Art
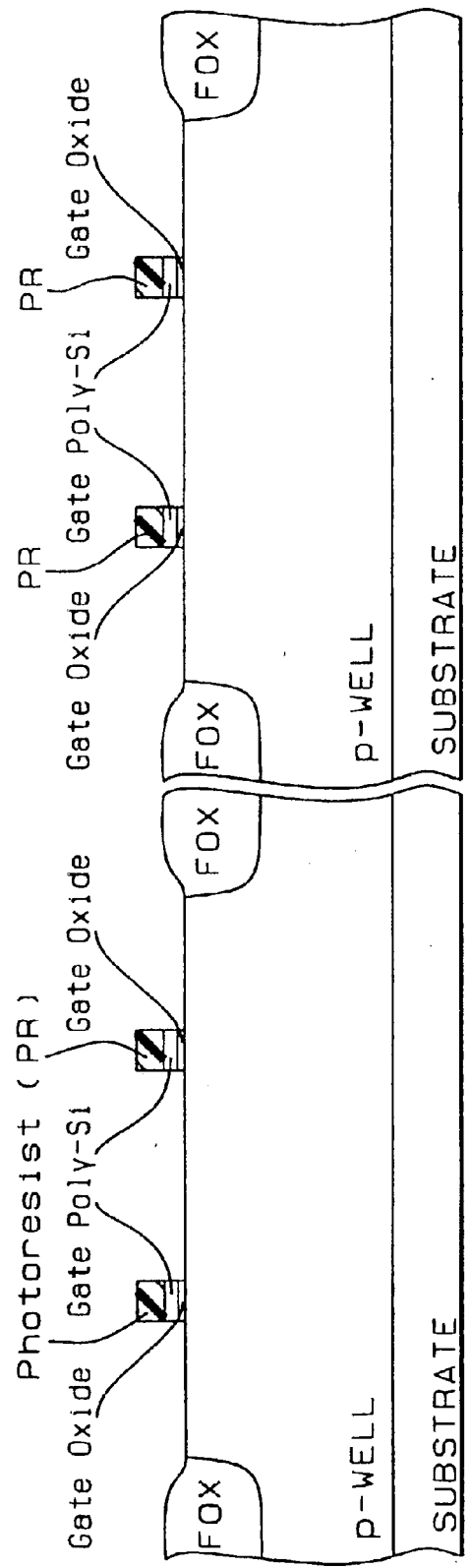
FIG. 2B – Prior Art

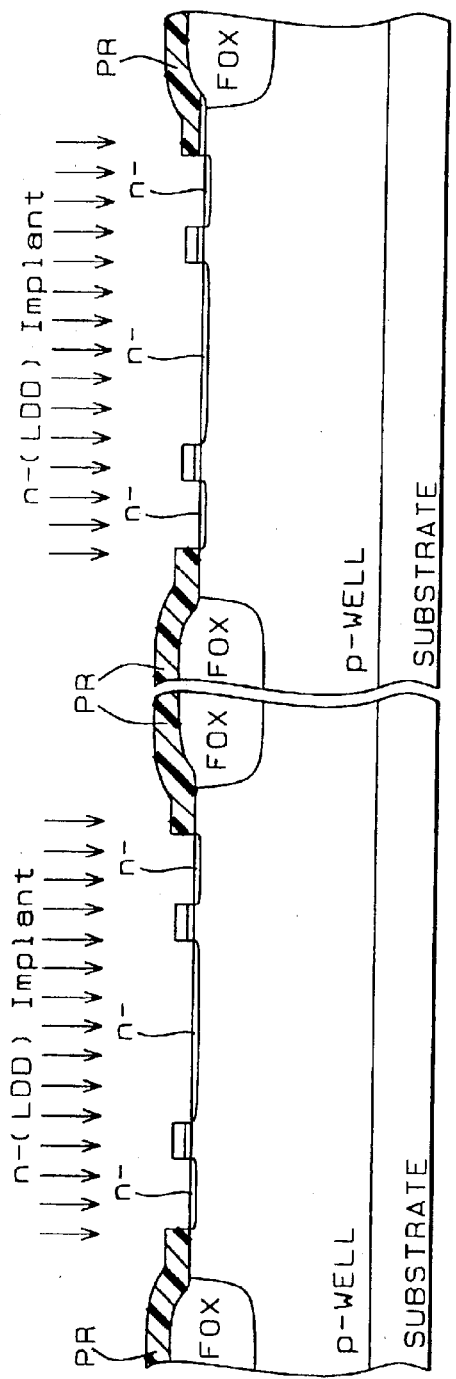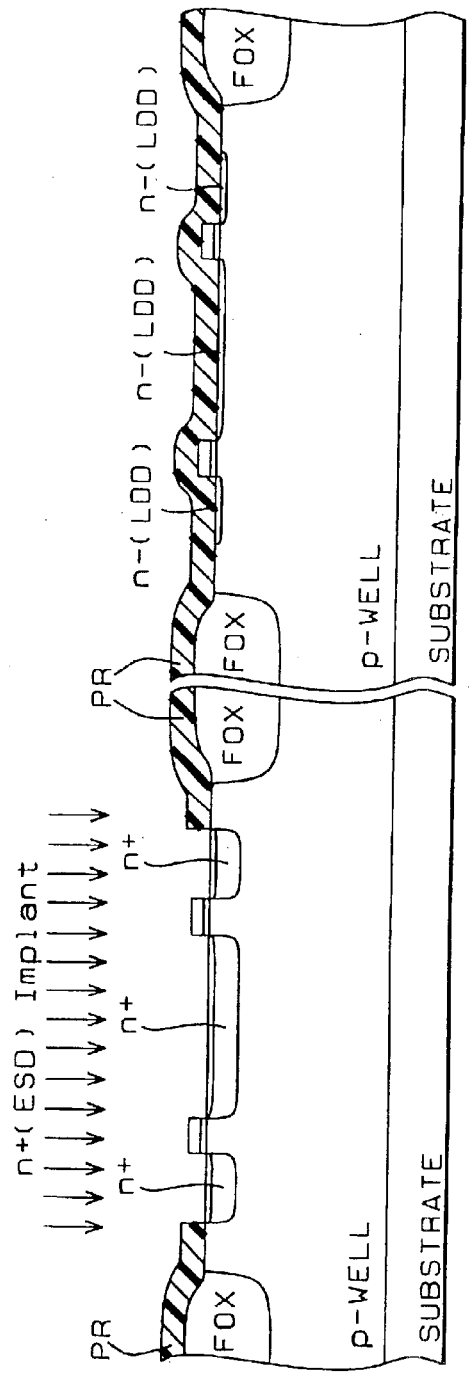

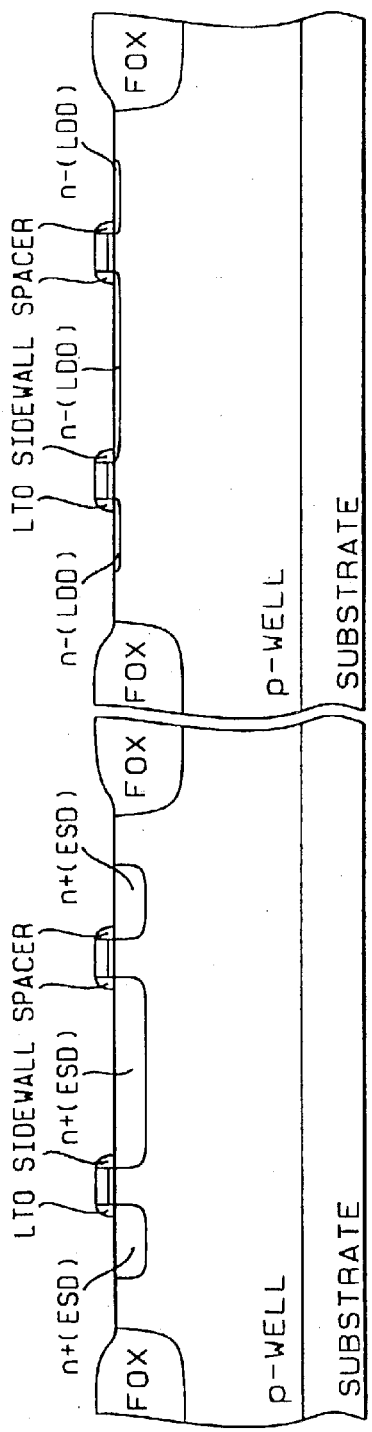
FIG. 2E – Prior Art
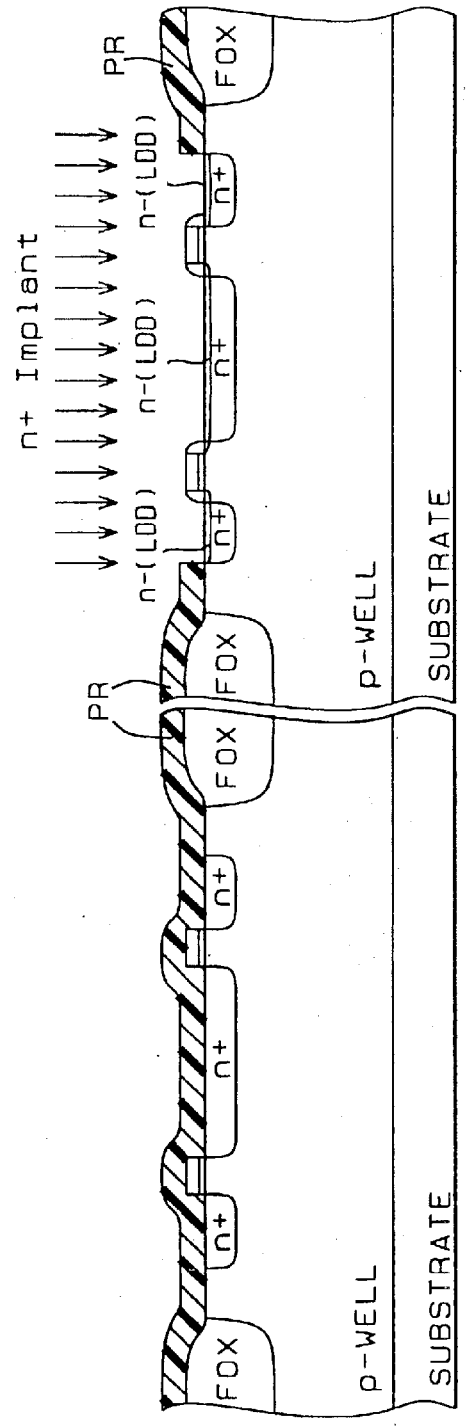
FIG. 2F – Prior Art

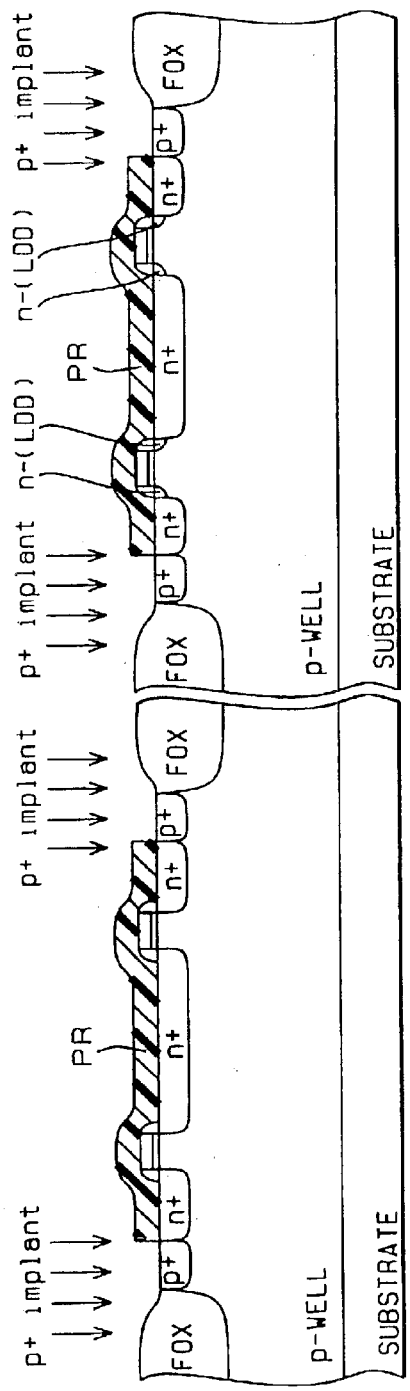
FIG. 2G – Prior Art
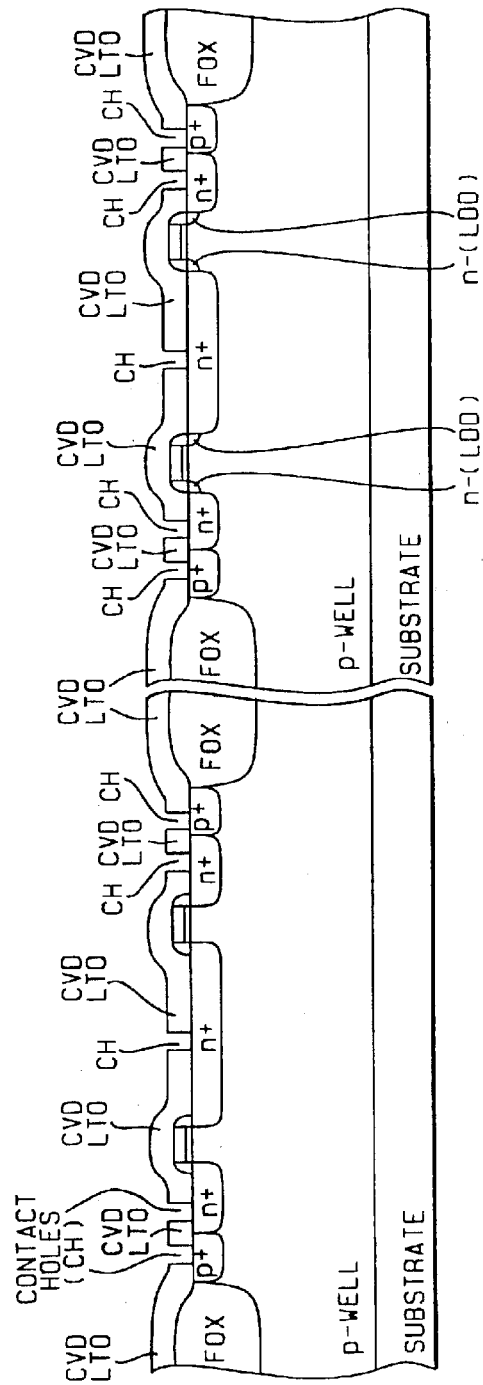
FIG. 2H – Prior Art

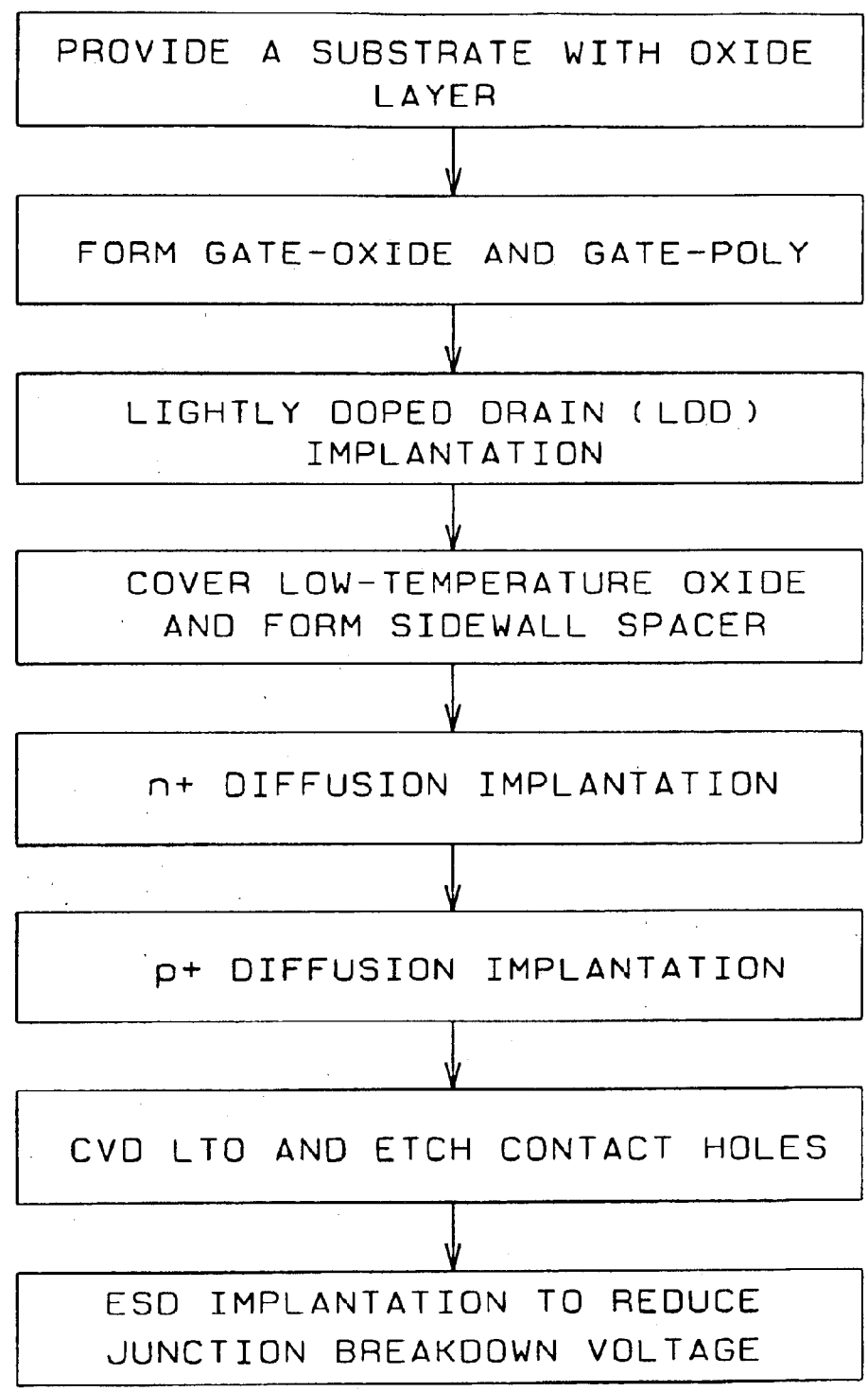
*FIG. 3 – Prior Art*

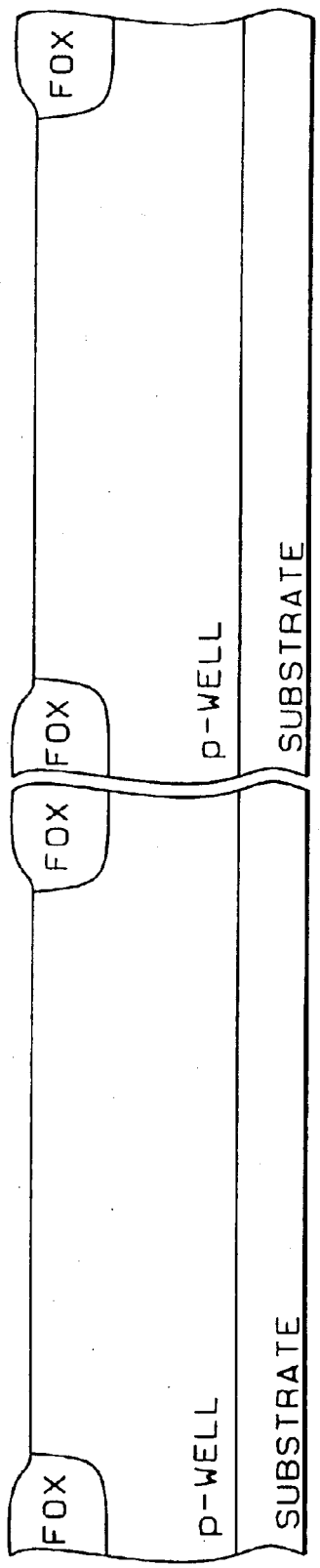
FIG. 4A – Prior Art
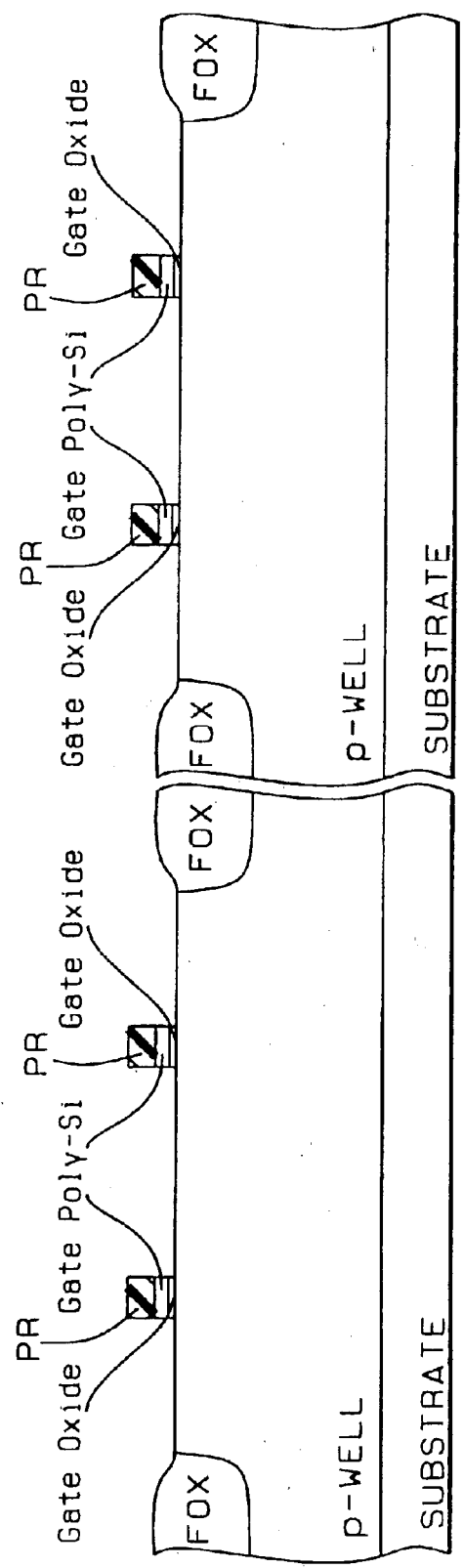
FIG. 4B – Prior Art

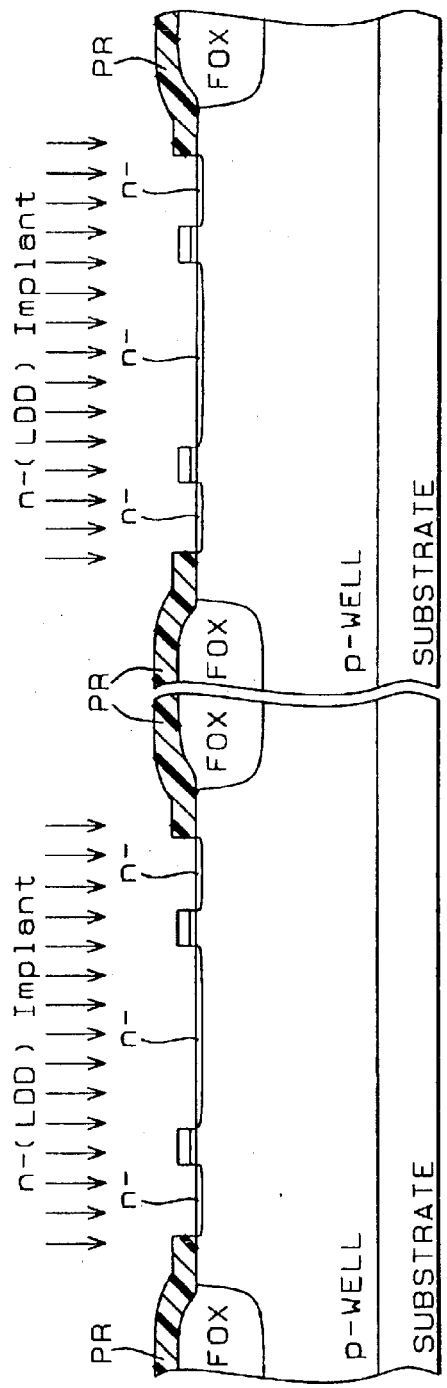
FIG. 4C – Prior Art
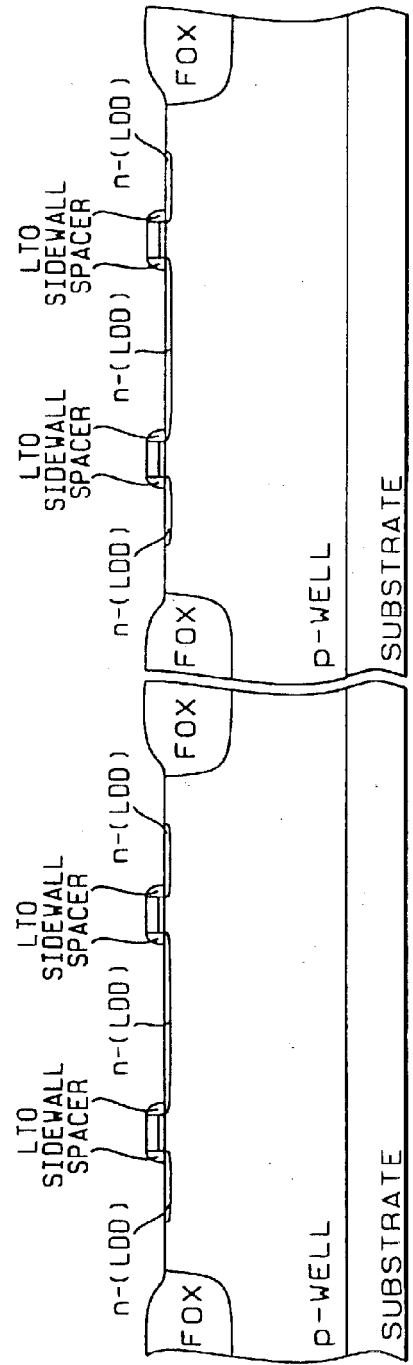
FIG. 4D – Prior Art

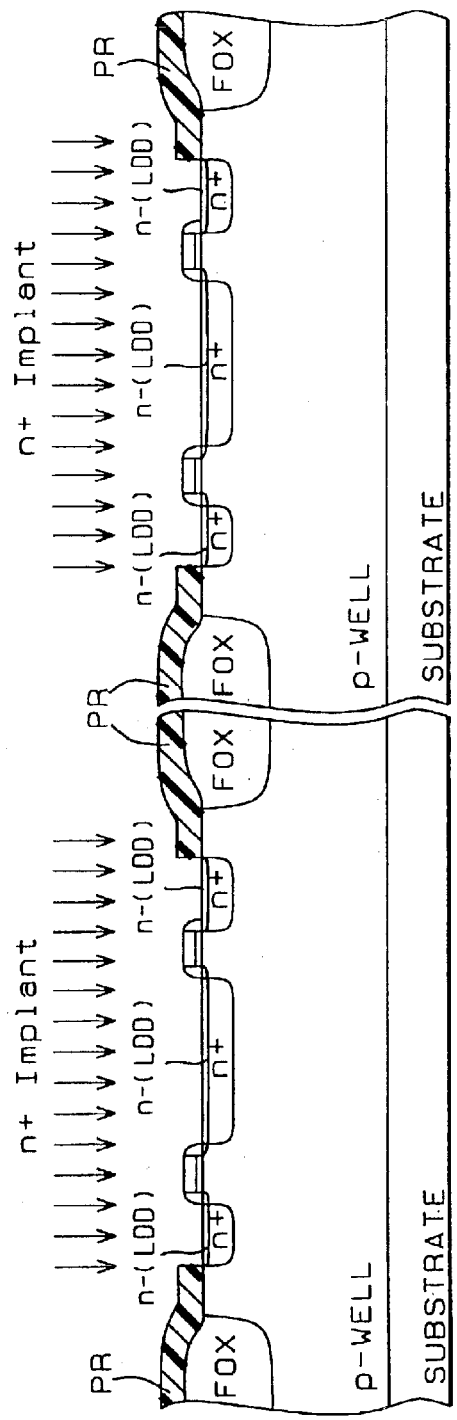
FIG. 4E – Prior Art
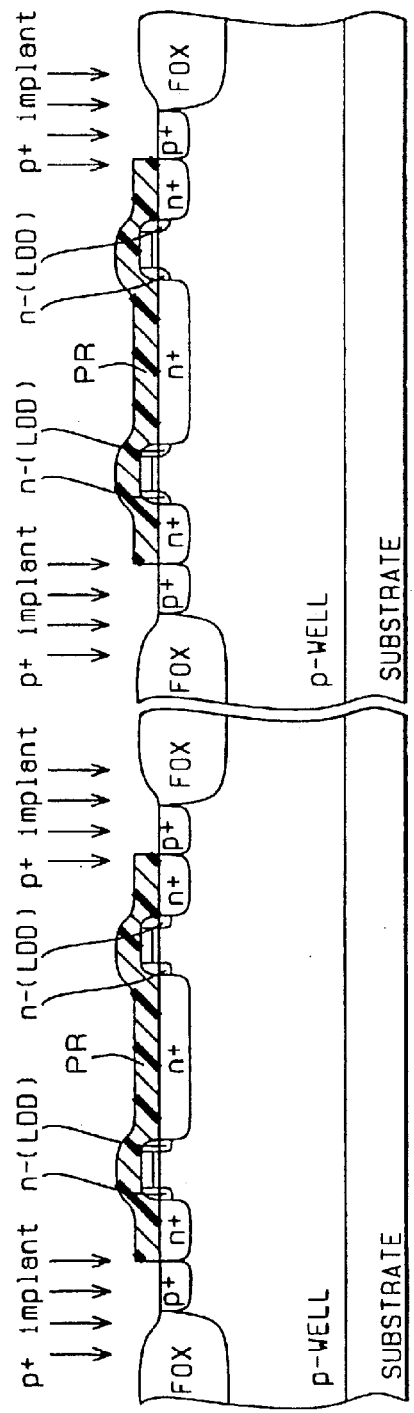
FIG. 4F – Prior Art

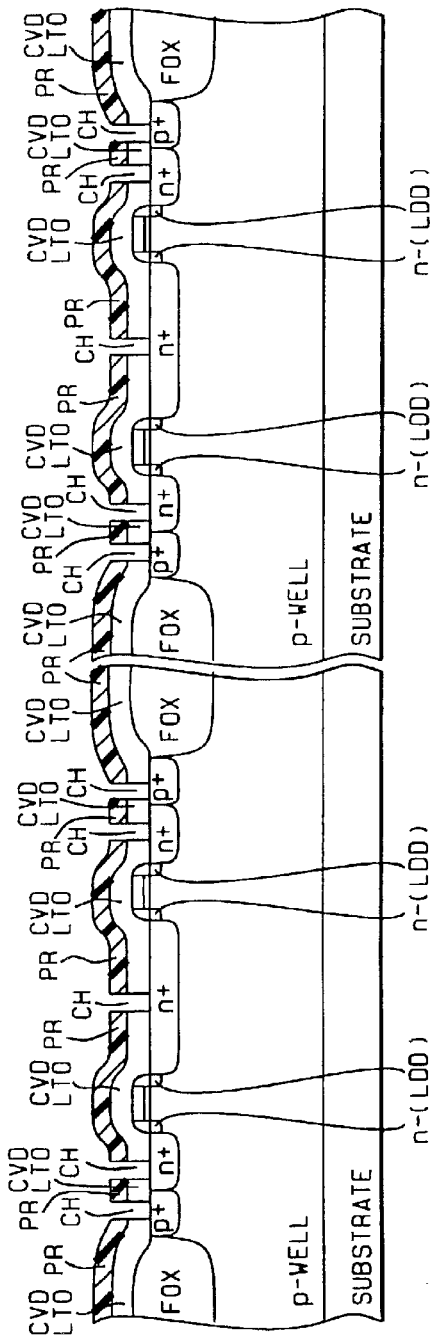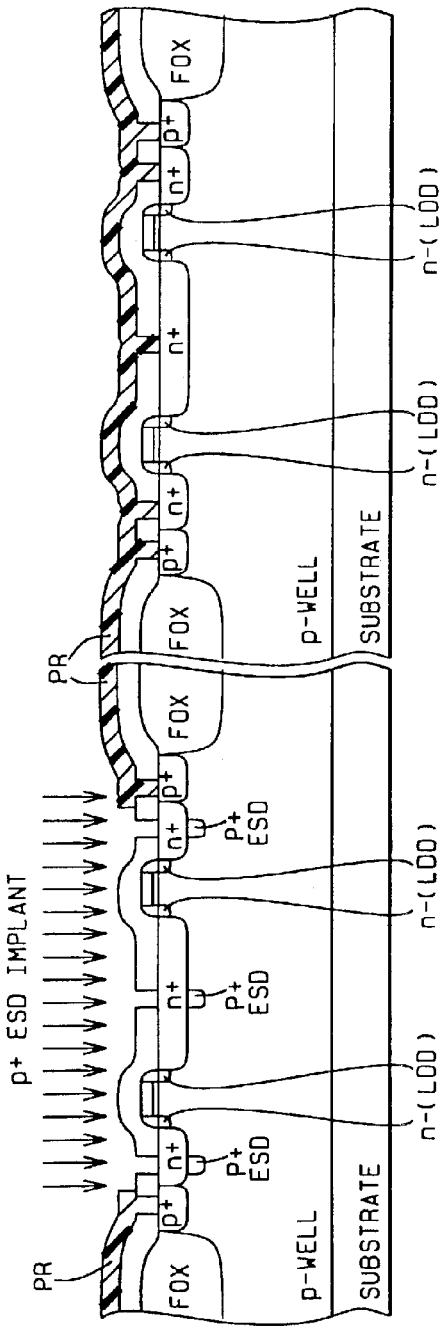

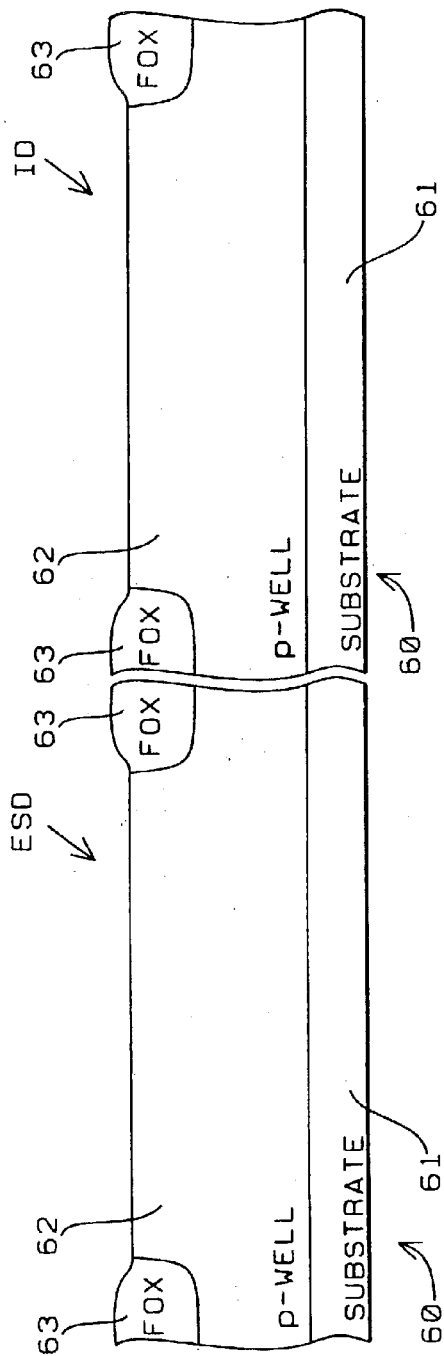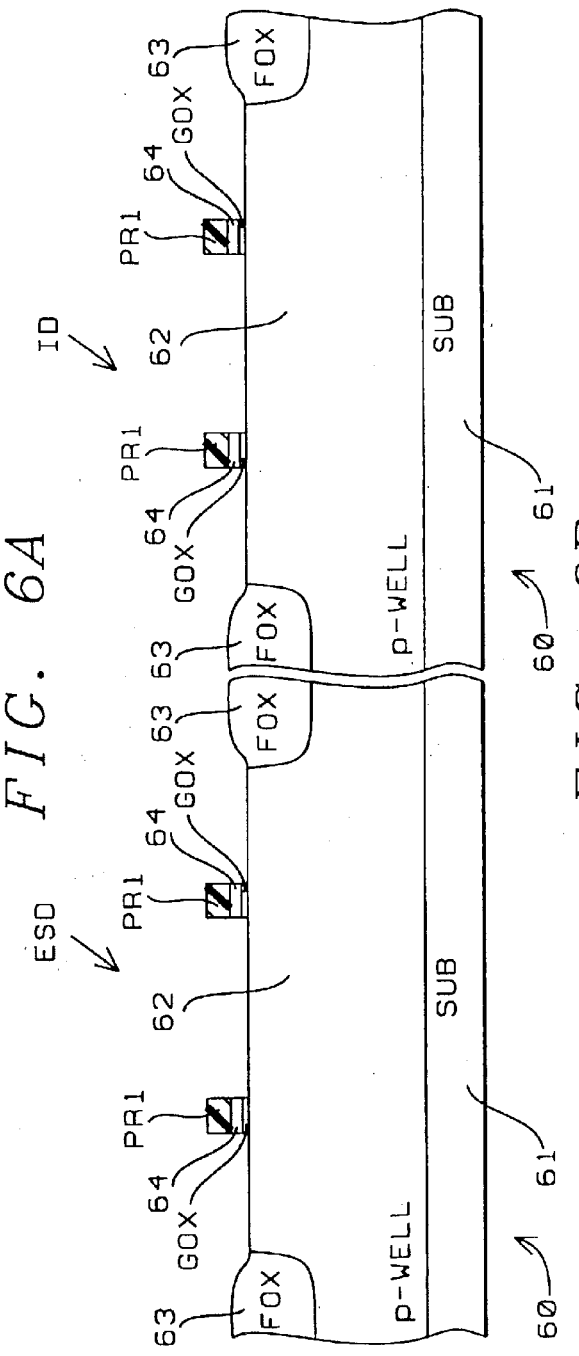
FIG. 6A
FIG. 6B

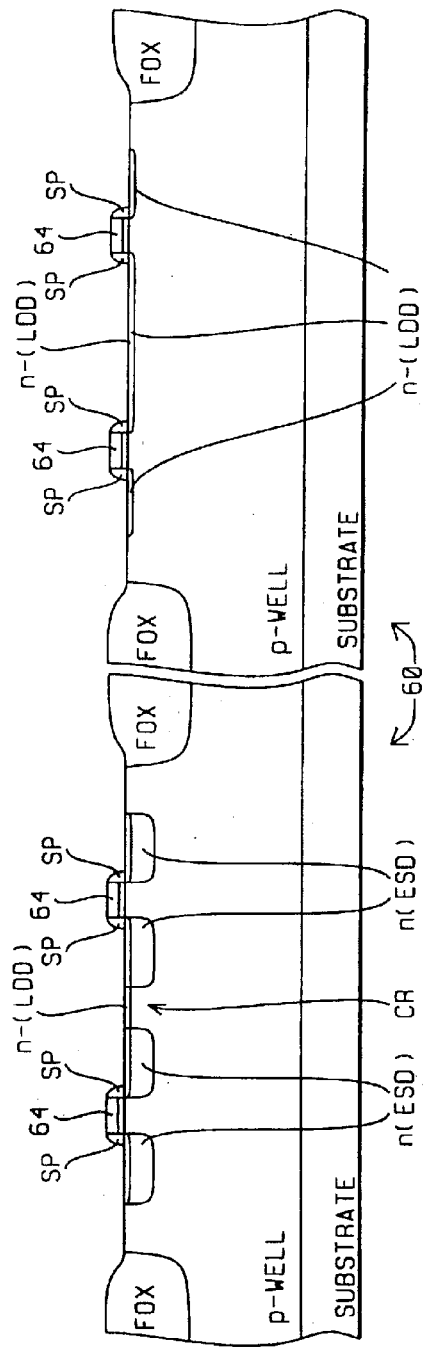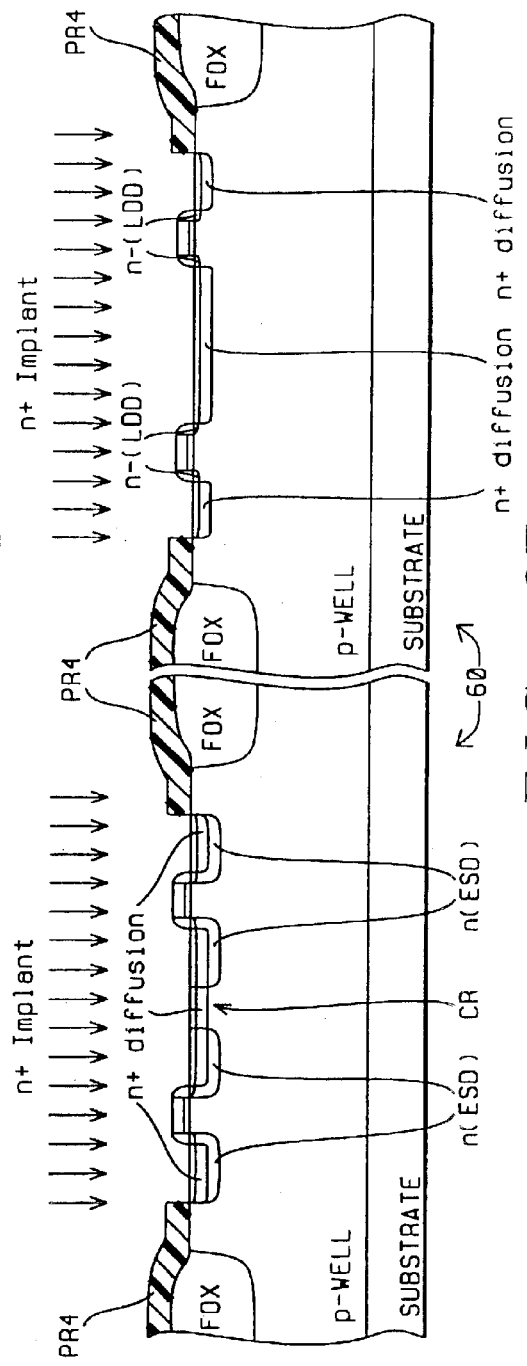

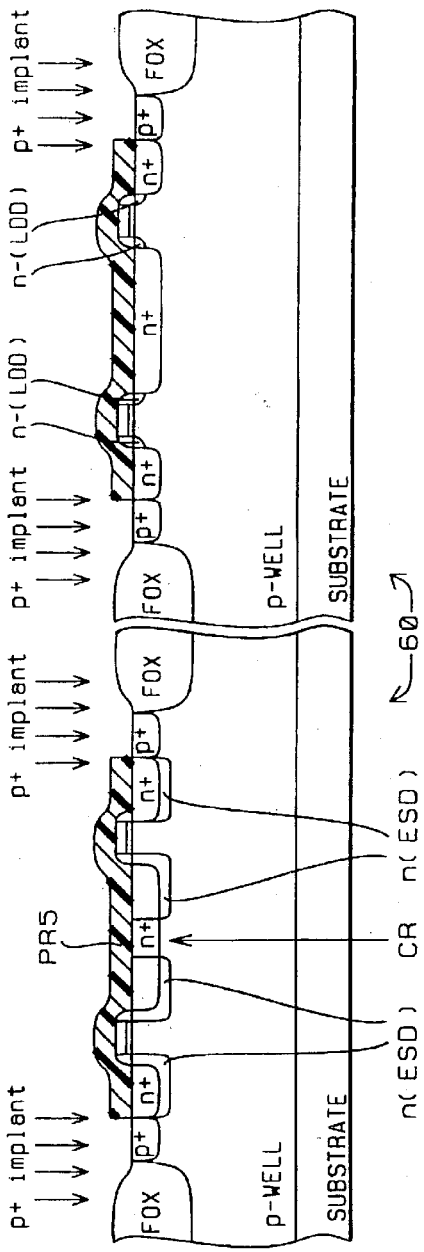
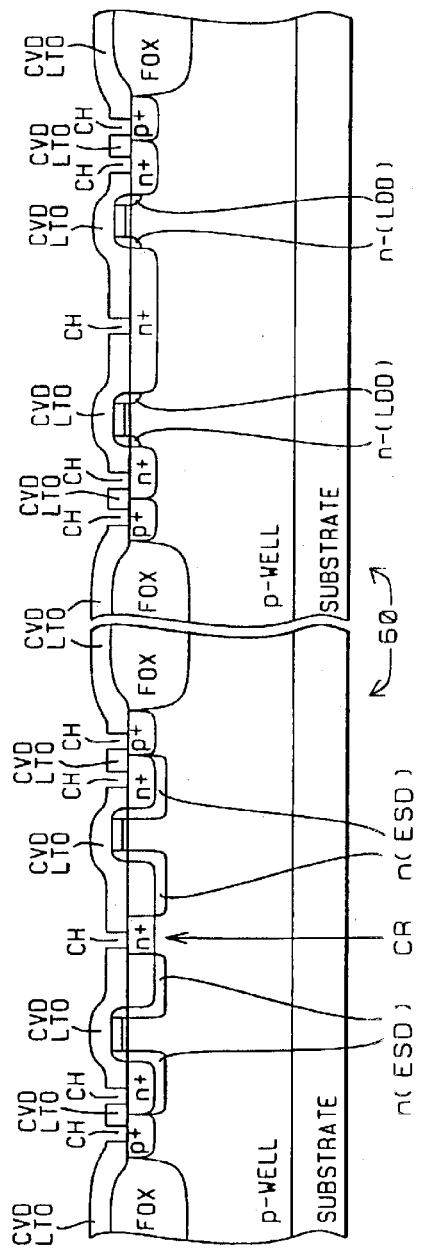
FIG. 6G
FIG. 6H

ID IMPLANTATION IN DEEP-SUBMICRON CMOS TECHNOLOGY FOR HIGH-VOLTAGE-TOLERANT APPLICATIONS (b) CROSS-REFERENCE TO RELATED APPLICATIONS

This application is a division of U.S. patent application Ser. No. 09/970,825 filed Oct. 5, 2001 which has issued as U.S. Pat. No. 6,514,839 B1

(c) STATEMENT REGARDING FEDERALLY SPONSORED RESEARCH OR DEVELOPMENT (Not Applicable)

(d) INCORPORATION BY REFERENCE (Not Applicable)

(e) BACKGROUND OF THE INVENTION

1. Field of the Invention

This invention relates to semiconductor devices and more particularly to methuds and apparatus for protection of semiconductor devices from electrostatic discharge damage.

2. Description of Related Art

ESD (electrostatic discharge) damage has become one of the main reliability concerns on the IC (integrated circuit) products. Especially, while the CMOS technology is developed into the deep-submicron regime, the scaled-down MOS devices and thinner gate oxide become more vulnerable to ESD stress. For general industrial specification, the input and output pins of the IC products have to sustain the human-body-model ESD stress of above 2000V. Thus, the ESD protection circuits have to be placed around the input and output pads of the IC devices to protect the IC devices against the ESD damage.

In the deep-submicron CMOS technology, the short-channel NMOS device (also PMOS device) has the Lightly Doped Drain (LDD) structure to overcome the hot-carrier effect. The LDD structure also generates a peak structure at the drain region, which closes to the surface channel. When such an NMOS device is stressed by a positive ESD voltage, the ESD current is focused and discharged through the LDD peak of the NMOS device structure. Because the LDD peak is the nearest region close to the grounded source, the first breakdown on the drain of the NMOS device happens at this LDD peak region. So, the LDD region with a far shallower junction depth is easily damaged by the ESD current to cause a far lower ESD level on the output NMOS device.

To improve the ESD level of the output NMOS device, one method is to remove the LDD peak from the output NMOS device. An output NMOS device, which has no LDD peak structure in its drain region, can sustain a far higher ESD level. The traditional method is to add an extra ESD-implantation process step into the CMOS process flow with an additional mask layer to make the output NMOS device having no LDD peak structure. The process of making such an NMOS device without LDD peak structure had been reported in some US patents, which are listed in references [1–7] below.

One typical method of such prior art is shown in FIG. 1 which is a flowchart of a process referred to herein as "the Prior Art I" process. FIGS. 2A–2H show cross-sectional views of the process flow of the Prior Art I process of FIG. 1. In FIGS. 2A–2H, the ESD protection devices are shown as the left-hand portions of the drawings and the internal devices are shown as the right-hand portions of the drawings.

The first step is to provide a substrate with a silicon oxide layer. The next step is to form a gate-oxide layer and a gate electrode layer of doped conductive polysilicon (poly) that is patterned into gate electrodes. That is followed by a self-aligned LDD implantation aside from the gate electrodes. A Heavily Doped ESD Implantation follows. Then cover with a Low-Temperature Oxide (LTO) and form sidewall spacers adjacent to the gate electrodes followed by a CMOS N+ Diffusion Implantation step. A CMOS P+ Diffusion Implantation step follows. A CVD LTO process deposits silicon oxide followed by contact hole etching.

FIG. 2A shows a cross-sectional views of a silicon semiconductor substrate in which a P-well doped with P type dopant has been formed with FOX (field oxide) regions at each end of an ESD Protection Device on the left and an Internal device formed on the right with intermediate portions of the device missing as indicated by the break-away lines in the intermediate FOX regions.

FIG. 2B shows the device of FIG. 2A after forming of a forming of a gate oxide layer, a poly gate electrode layer, a first photoresist mask PR and patterning of the gate electrode stack.

FIG. 2C shows an N− LDD implantation into the product of FIG. 2B aside from peripheral areas including the FOX regions which are protected by a second photoresist mask.

FIG. 2D shows the device of FIG. 2C after the heavy N+ doping ESD protection device implantation of the N+ drain/source (D/S) regions of the ESD protection devices where a third photoresist mask protects the Internal Device plus areas aside from the drain/source regions and the gate electrode stacks including the FOX regions and the entire internal device.

Figure 5:
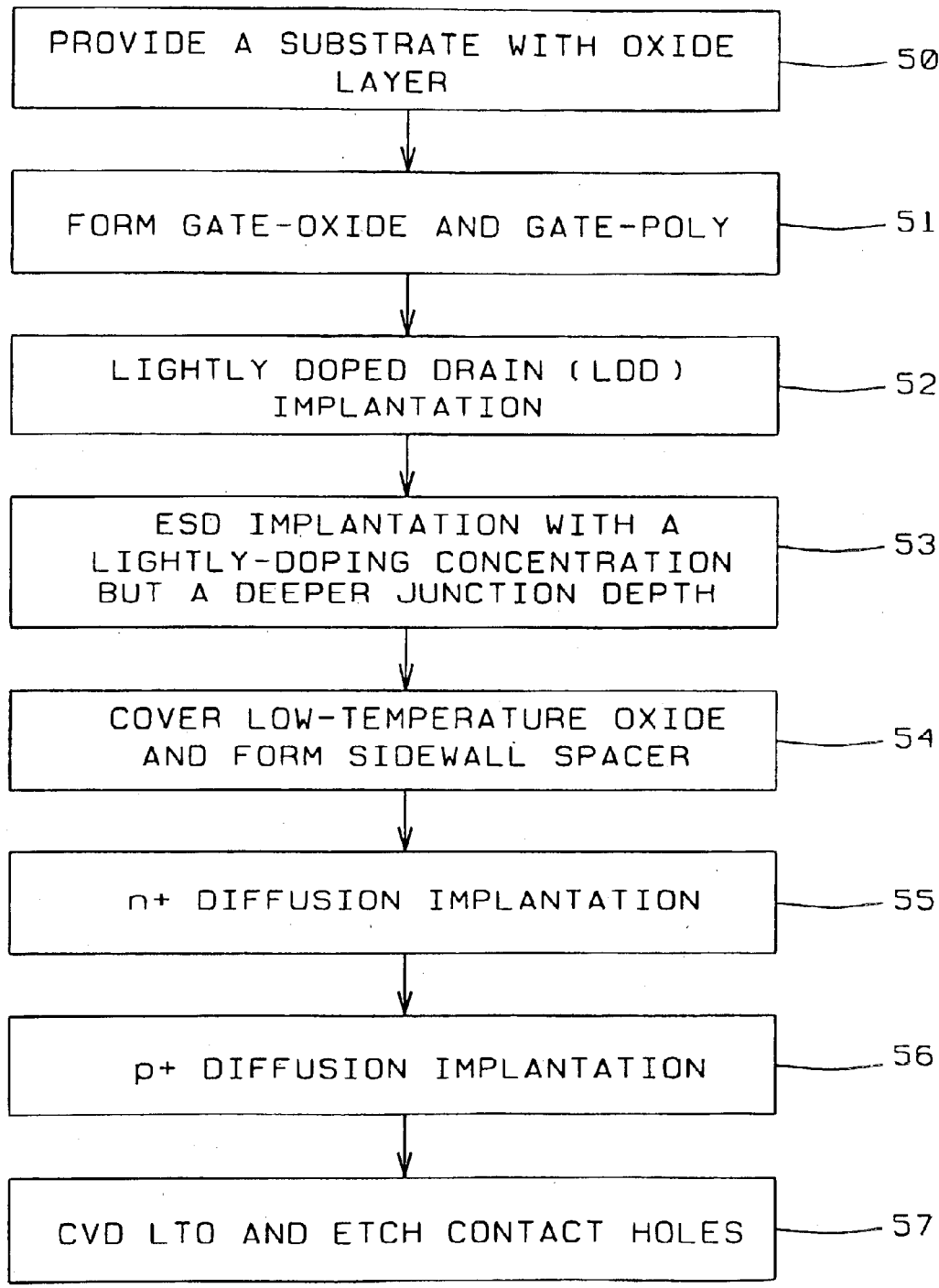

The additional ESD protection device implantation, as shown in FIG. 2D, is added into the process flow with one additional mask layer to form the NMOS without LDD peak structure. Such ESD protection device implantation is done before the formation of sidewall spacers on the gate oxide which follow as shown in FIG. 2E.

FIG. 2E shows the device of FIG. 2D after forming of sidewall spacers on the sidewalls of all of the gate electrode stacks.

FIG. 2F shows the device of FIG. 2E after heavy N+ doping for the N+ D/S diffusion of the internal devices aside from the ESD protection device and peripheral areas including the FOX regions which are protected by a fourth photoresist mask.

FIG. 2G shows the device of FIG. 2F after the doping of a set of P+ diffusions into P+ doped regions between the D/S regions and the FOX regions which are protected by a fifth photoresist mask.

FIG. 2H shows the device of FIG. 2G after a contact hole etching step of forming contact holes CH to the P+ diffusions and the D/S regions.

The LDD peak in the ESD protection device has been covered by the implanting with an extra N+ implantation. The ESD robustness degradation due to the LDD peak in the NMOS structure can be overcome. Thus the ESD level of the ESD protection device can be improved.

Another method for improving the ESD level of the NMOS with LDD peak structure is to generate a low-breakdown-voltage junction rather than through the LDD peak structure. The process for making such an NMOS device with a lower-breakdown-voltage junction is reported in some U.S. patents [8–11].

FIG. 3 is a flow chart of a typical method of such prior art referred to herein as "Prior Art II" [8]. In the flowchart shown in FIG. 3, (Prior Art II) the method illustrated is a variation of the process of FIG. 1. The flow starts by providing a substrate with a FOX oxide layer which is patterned as FOX regions as described above. Then form a gate-oxide and gate-poly as described above. Then perform a LDD Implantation as described above. The process is different at this stage as the next steps are to perform Cover Low-Temperature Oxide (LTO) and Form Sidewall Spacer steps. Next perform N+ Diffusion Implantation, the P+ Diffusion Implantation steps. Next perform the steps of CVD LTO and Etching of Contact Holes. Finally, the step is to perform an ESD implantation to reduce junction breakdown voltage at the end of the process. The process of FIG. 3 is shown in detail in FIGS. 4A–4H which shown the typical step-by-step process flow of Prior Art II [8].

FIGS. 4A–4H show the cross-sectional views of step-by-step the process flow of Prior Art II. In those cross-sectional views, the left-hand portions of the drawings show the ESD protection devices and the right-hand portions of the drawings show the internal devices.

FIG. 4A shows a cross-sectional views of a silicon semi-conductor substrate in which a P-well doped with P type dopant has been formed with FOX (field oxide) regions at each end of an ESD Protection Device on the left and an Internal device formed on the right with intermediate portions of the device missing as indicated by the break-away lines in the intermediate FOX regions.

FIG. 4B shows the device of FIG. 4A after forming of a gate oxide layer, a poly gate electrode layer, a first photoresist mask and patterning of the gate electrode stack.

FIG. 4C shows an –LDD implantation into the product of FIG. 4B aside from peripheral areas including the FOX regions which are protected by a second photoresist mask.

FIG. 4D shows the device of FIG. 4C after forming of sidewall spacers on the sidewalls of all of the gate electrode stacks which is different from the process of FIGS. 2A–2H.

FIG. 4E shows the device of FIG. 4D after the heavy N+ doping ESD Protection device and Internal Device implantation of the N+ drain/source (D/S) regions of the ESD protection devices where a third photoresist mask protects the areas aside from the drain/source regions and the gate electrode stacks, including the FOX regions.

FIG. 4F shows the device of FIG. 4E after the doping of a set of P+ diffusions into P+ doped regions between the D/S regions and the FOX regions which are protected by a fourth photoresist mask.

FIG. 4G shows the device of FIG. 4F after a contact hole etching step for forming contact holes to the P+ diffusions and the D/S regions.

FIG. 4H shows the device of FIG. 4G after an ESD protection device implantation with P-type impurity is implanted deeply into the bottom of drain contact holes to reduce the junction breakdown voltage under the drain contact. The extra ESD implantation is added after the contact etching steps, where the ESD implantation region in only located at the center of the drain region including the junction under the drain contact. A fifth photoresist mask covers the internal device as well as the FOX and P+ diffusion contact holes in the ESD protection device.

In FIG. 4H, the ESD implantation is located at the junction under the drain contact to reduce its breakdown voltage. The junction breakdown voltage is dependent on the doping concentrations of the P-type and N-type diffusions around the P-N junction.

The junction region with the ESD protection device implantation of FIG. 4H has a lower breakdown voltage.

While the ESD voltage is conducted to the drain of the output NMOS device which is connected to the output pad, the junction region with a lower breakdown voltage can be broken first to bypass the ESD current into the P-well or the substrate. The ESD current is discharged far away from the LDD peak structure and the surface channel, as well as the substrate/well has a large volume to dissipate the heat generated by the ESD current, so the ESD protection devices can sustain a far higher ESD stress.

Generally, the output buffer is used as the ESD protection devices also. To make the output NMOS device with a lower junction breakdown voltage, it needs an extra mask layer and some additional process steps adding into the CMOS process flow. With such methods, the drain breakdown voltage reduces to a lower voltage level. If the output NMOS device in the tri-state condition must sustain high voltage input signals on the pad, the lower junction breakdown voltage due to the additional ESD implantation may cause an unexpected leakage current from the output pad to ground through the low-breakdown junction in the NMOS device.

ESD (electrostatic discharge) damage has become a main reliability concern on the IC (integrated circuit) products. Especially, while the CMOS technology is developed into the deep-submicron regime, the scaled-down MOS devices and thinner gate oxide become more vulnerable to ESD stress. For general industrial specification, the input and output pins of the IC products have to sustain the human-body-model ESD stress of above 2000V. Thus, the ESD protection circuits have to be placed around the input and output pads of the IC devices to protect the IC devices against the ESD damage.

In the output buffers of CMOS IC devices, the output NMOS/PMOS devices are often designed with large device dimensions W/L (Width/Length) to provide the required driving current to the external loads. The large-size output NMOS/PMOS devices also work as the ESD-protection devices to protect themselves. For example, in a 0.35 μm CMOS process, an output NMOS device with a device dimension of W/L=300/0.5 (μm/μm) can sustain the ESD level of greater than 2000V. However, such an NMOS device must be drawn by following the specified ESD design rules in the 0.35 μm CMOS process to sustain a high ESD level. One of the effective methods for improving the ESD level of the output NMOS device and PMOS device is the ESD implantation step.

Figure 7:
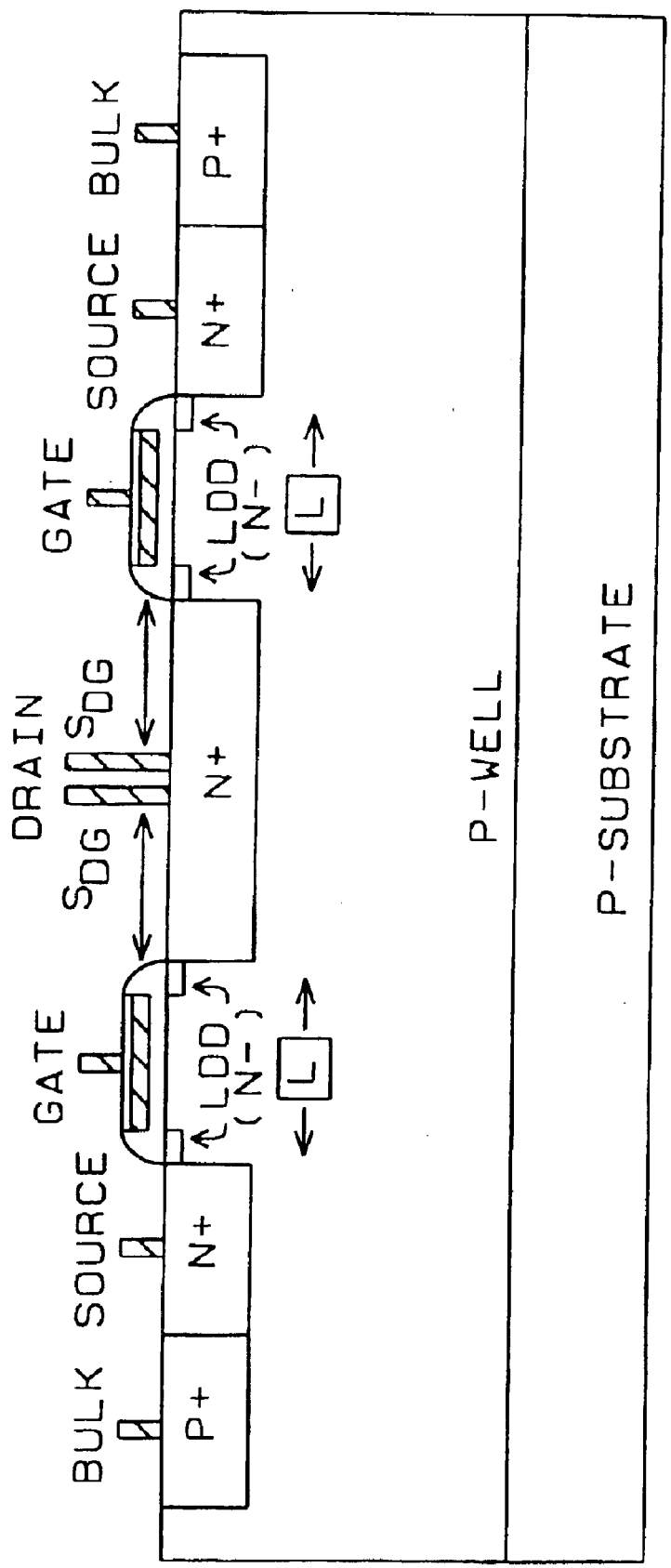
Figure 8:
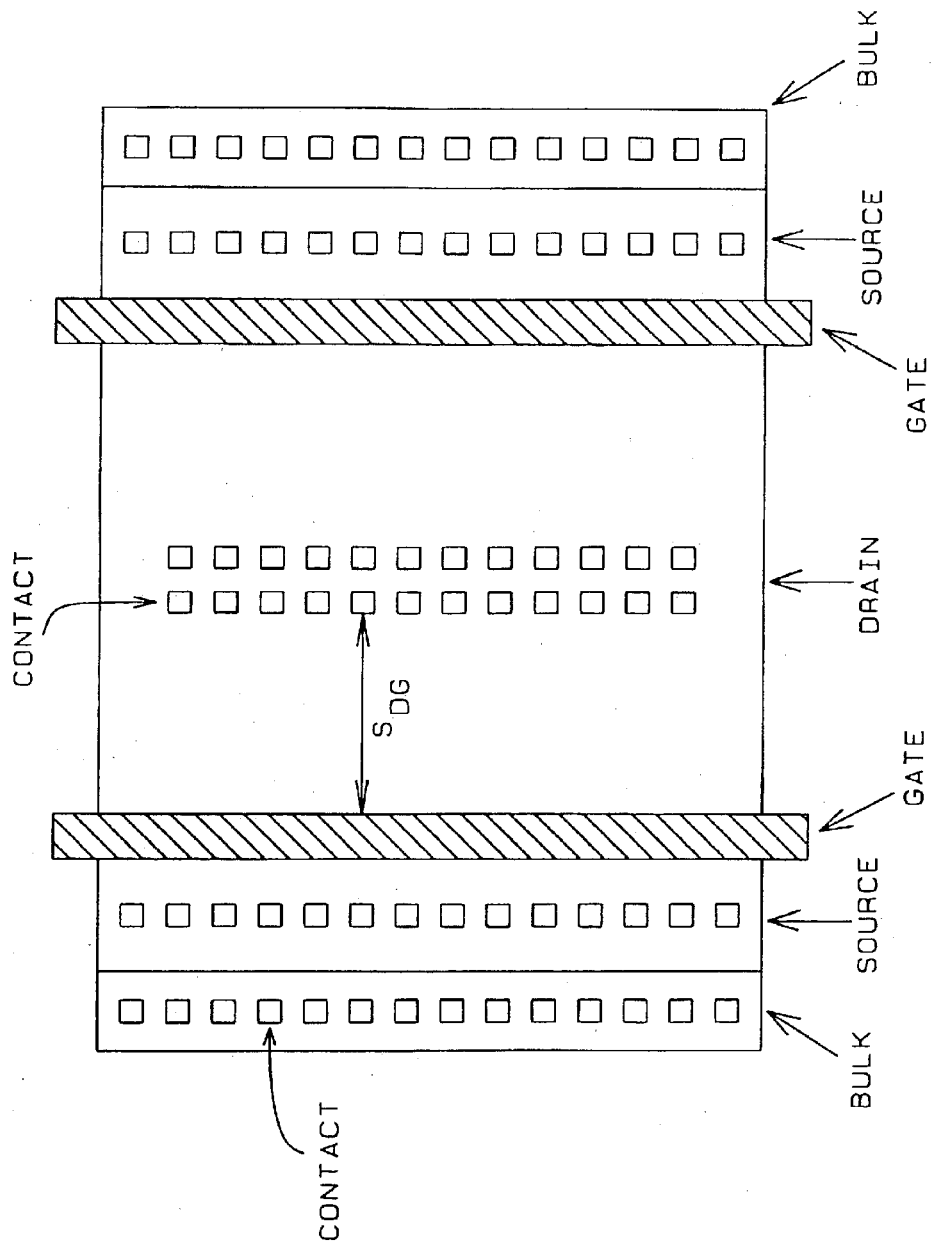
Figure 9:
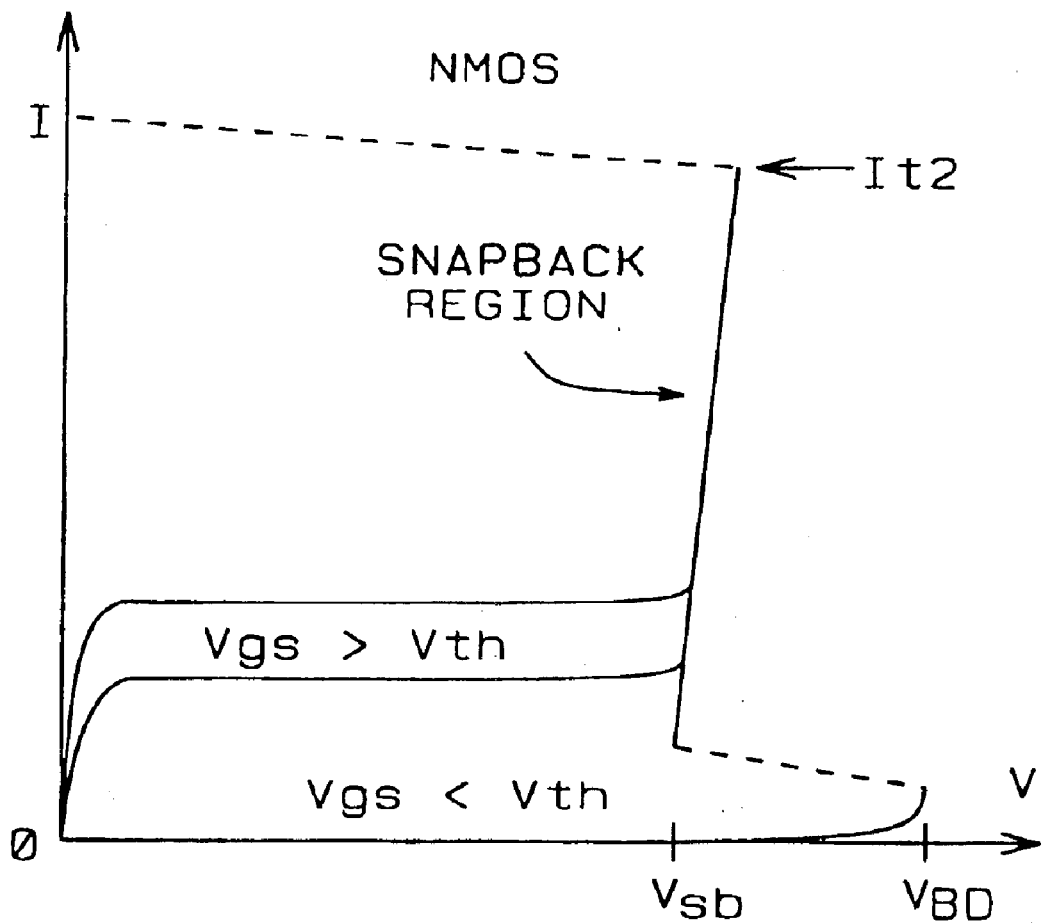

The device structure of an output NMOS device is drawn in FIG. 7, whereas its corresponding layout top view is shown in FIG. 8, and its device I-V characteristics are shown in FIG. 9. The output NMOS device is often drawn with a wider spacing $S_{DG}$ in the layout. According to the published papers [12–13], the typical value for this spacing $S_{DG}$ is around 3–5 μm for an NMOS device to sustain a high ESD level. When the NMOS device is stressed by the ESD events with an Over-stress current, the NMOS device enters into its snapback region in its I-V curves, as shown in FIG. 9. The parasitic lateral N-P-N BJT (Bipolar Junction Transistor) in the NMOS device is triggered on to generate the snapback region in the I-V curve of the NMOS device. The maximum current that the parasitic lateral N-P-N BJT in the NMOS device can sustain is defined as the secondary breakdown current, marked as the It2 current in FIG. 9. While the ESD current is higher than the It2 current of an output NMOS device, the NMOS device will be permanently damaged by the ESD current. Thus, the operating region of the output NMOS device to bypass the ESD current is the snapback region of its I-V curve. The different device structures and layout styles cause different It2 current values, even if the NMOS device has the same W/L (Width/Length) device dimension.

In the deep-submicron CMOS technology, the NMOS device (also PMOS device) has the LDD (lightly-doped drain) structure, as shown in FIG. 7, to overcome the hot-carrier effect on the short-channel devices. The LDD structure also generates a peak structure at the drain region, which closes to the surface channel. This is the device structure shown in FIG. 1 and the ESD current path shown in FIG. 4.

When such an NMOS device is stressed by a positive ESD voltage, the ESD current is focused and discharged through the LDD peak in the NMOS device structure. The ESD current path on the NMOS device with LDD structure is drawn in FIG. 10. The ESD current is conducted into the drain region through the drain contact, and then conducted to the LDD peak. Because the LDD peak is the nearest region close to the grounded source, the first breakdown on the drain of the NMOS device happens at this LDD peak region. The LDD peak region often has a far shallower junction depth (about 0.02 $\mu$m), as compared to the drain N+ diffusion region (about 0.2 $\mu$m). The ESD current discharging path along the NMOS device with LDD peak is shown by the line with arrows in FIG. 10. Thus, the LDD region with a far shallower junction depth and diffusion volume is easily damaged by the ESD current to cause a far lower ESD level on the output NMOS device.

Figure 11:
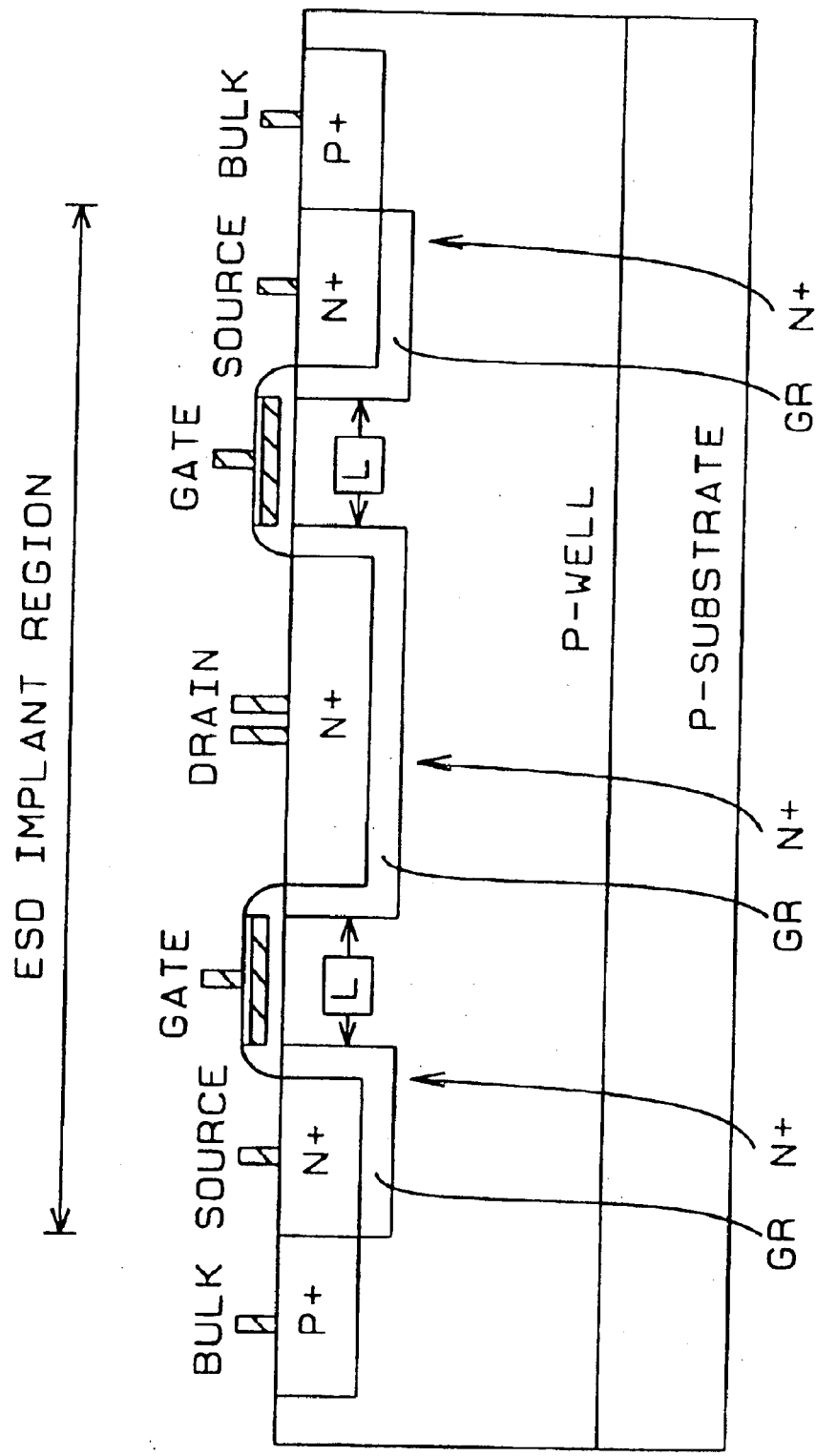

To improve the ESD level of the output NMOS device, one method is to remove the LDD peak from the output NMOS device. An output NMOS device, which has no LDD peak structure in its drain region, can sustain a far higher ESD level. The traditional method is to add an extra ESD-implantation step into the CMOS process flow with an additional mask layer to make the output NMOS device having no LDD peak structure, as that shown in FIG. 11. The typical top view of layout to make the NMOS device without LDD peak structure is drawn in FIG. 12. The additional ESD implantation is added into the process flow with at least one additional mask layer to mask the NMOS device without LDD peak structure. Such ESD implantation can be done before or after the formation of sidewall spacer on the gate oxide. The methods for making such an NMOS device without LDD peak structure was reported in some US patents [1–7]. In FIG. 11, the LDD peak in the NMOS device has been covered or removed by the ESD implantation with extra N+ region (the region GR in FIG. 11). The ESD degradation due to the LDD peak in the NMOS device structure can be overcome, thus the ESD level of the output NMOS device can be restored to a higher level with a reasonable spacing from drain contact to the poly gate edge in the layout.

Figure 13:
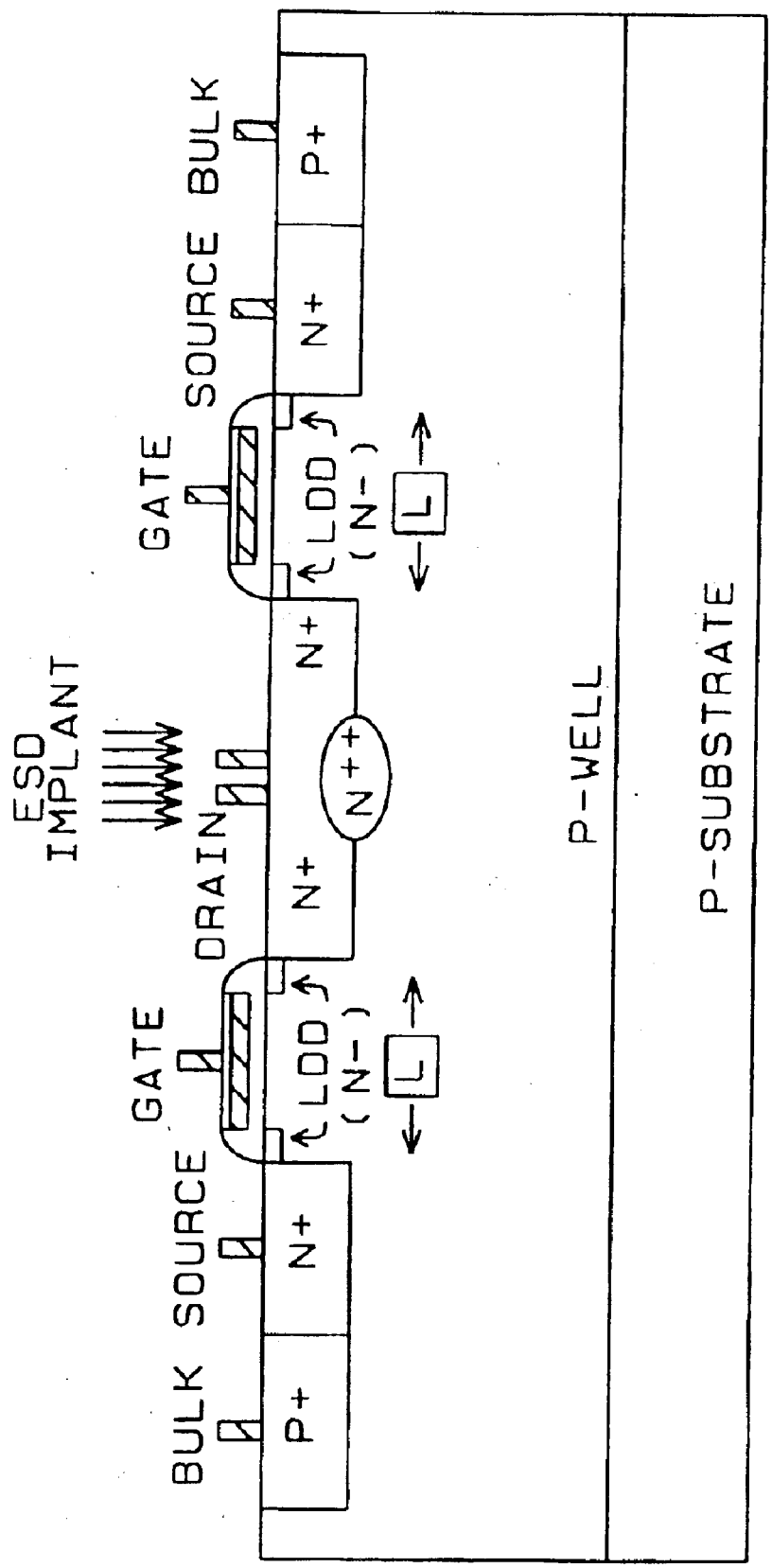
Figure 14:
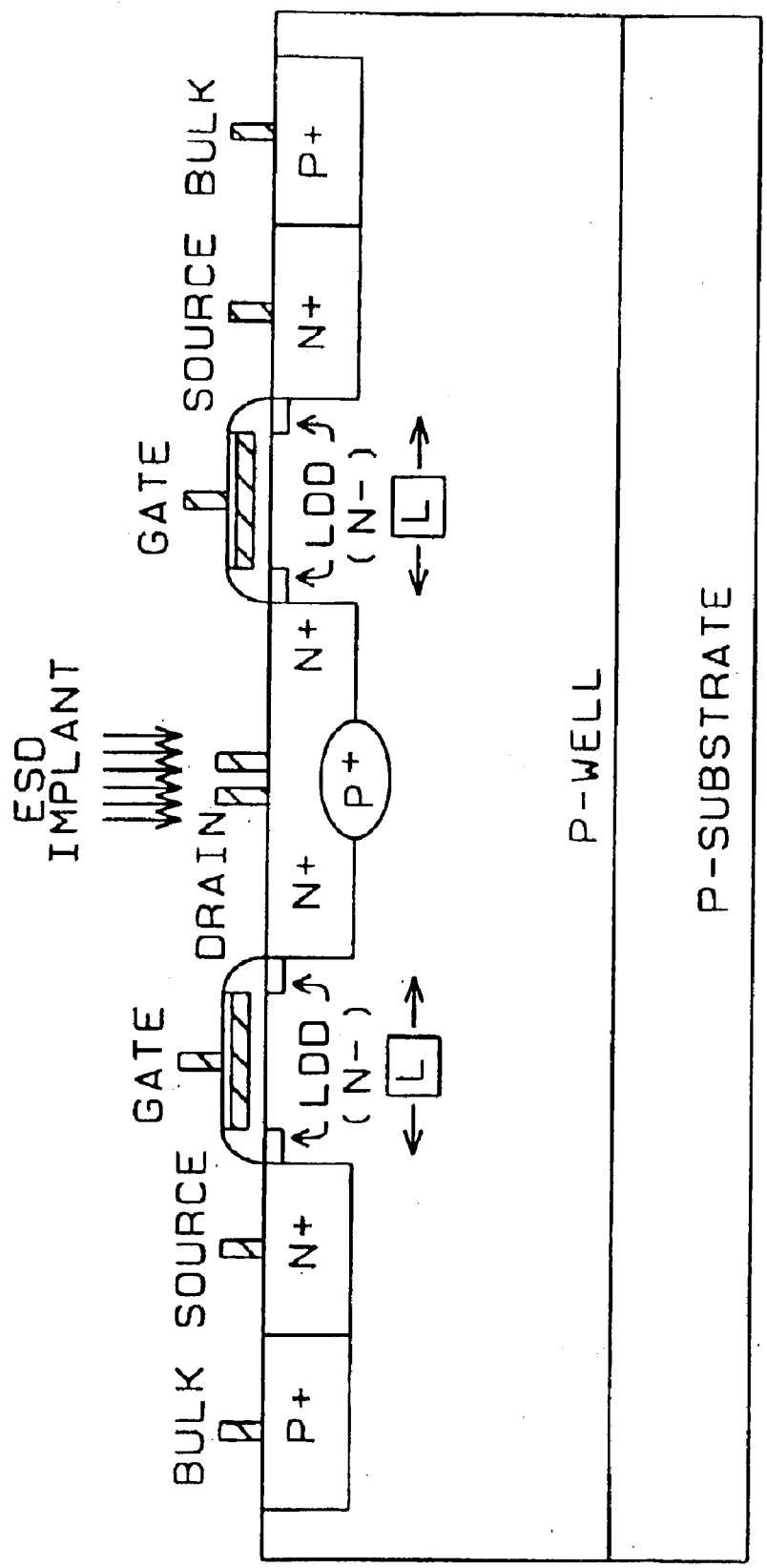

Another method for improving ESD level of an NMOS device with an LDD peak structure is to generate a low-breakdown-voltage junction in the drain diffusion; whereby the ESD current is discharged through the low-breakdown-voltage junction rather than through the LDD peak structure. Such methods are illustrated in FIG. 13 and FIG. 14. The layout for realization of such a method is drawn in FIG. 15, where the ESD implantation region is located only at the center of the drain region including the junction under the drain contact.

In FIG. 13, a high concentration of an N++ dopant material is implanted around the junction under the drain contact to reduce the breakdown voltage around this junction region.

In FIG. 14, a high concentration of a P+ dopant material is implanted around the junction under the drain contact to reduce the breakdown voltage around this junction region.

From the semiconductor physics theory, the P-N junction with a higher doping concentration has a lower breakdown voltage. The junction breakdown voltage is dependent on the doping concentrations of the P and N diffusions around the P-N junction. For example in a 0.35 $\mu$m 3.3V CMOS process, the original junction breakdown voltage of an output NMOS device with LDD structure is about 8V.

On the other hand, if such an output NMOS device is implanted with the P+ (boron) dopant material as that shown in FIG. 14, the junction breakdown voltage is reduced to only about 6V. The junction region with such ESD implantation (FIG. 13 or FIG. 14) has a lower breakdown voltage. When an ESD voltage is applied to the drain of the output NMOS device which is connected to the output pad, the junction region with a lower breakdown voltage can be broken first to bypass the ESD current into the P-well (or substrate). The ESD current is discharged far away from the LDD peak structure and the surface channel, as well as the substrate/well which has a large volume to dissipate the heat generated by the ESD current. Thus the output NMOS device can sustain a far higher ESD stress. To make a lower junction breakdown voltage output NMOS device, there is a requirement of adding an extra mask layer needs and some additional steps to the CMOS process flow. Steps for making such an NMOS device with a lower breakdown-voltage junction were reported in some US patents, which are listed in [8–11]. With such methods, drain breakdown voltage is reduced to a lower voltage level. If the output NMOS device in the tri-state condition must sustain a high voltage on the pad, the lower junction breakdown voltage due to the additional ESD implantation may causes the unexpected leakage current from the output pad to ground through the low-breakdown junction in the NMOS device.

Figure 16:
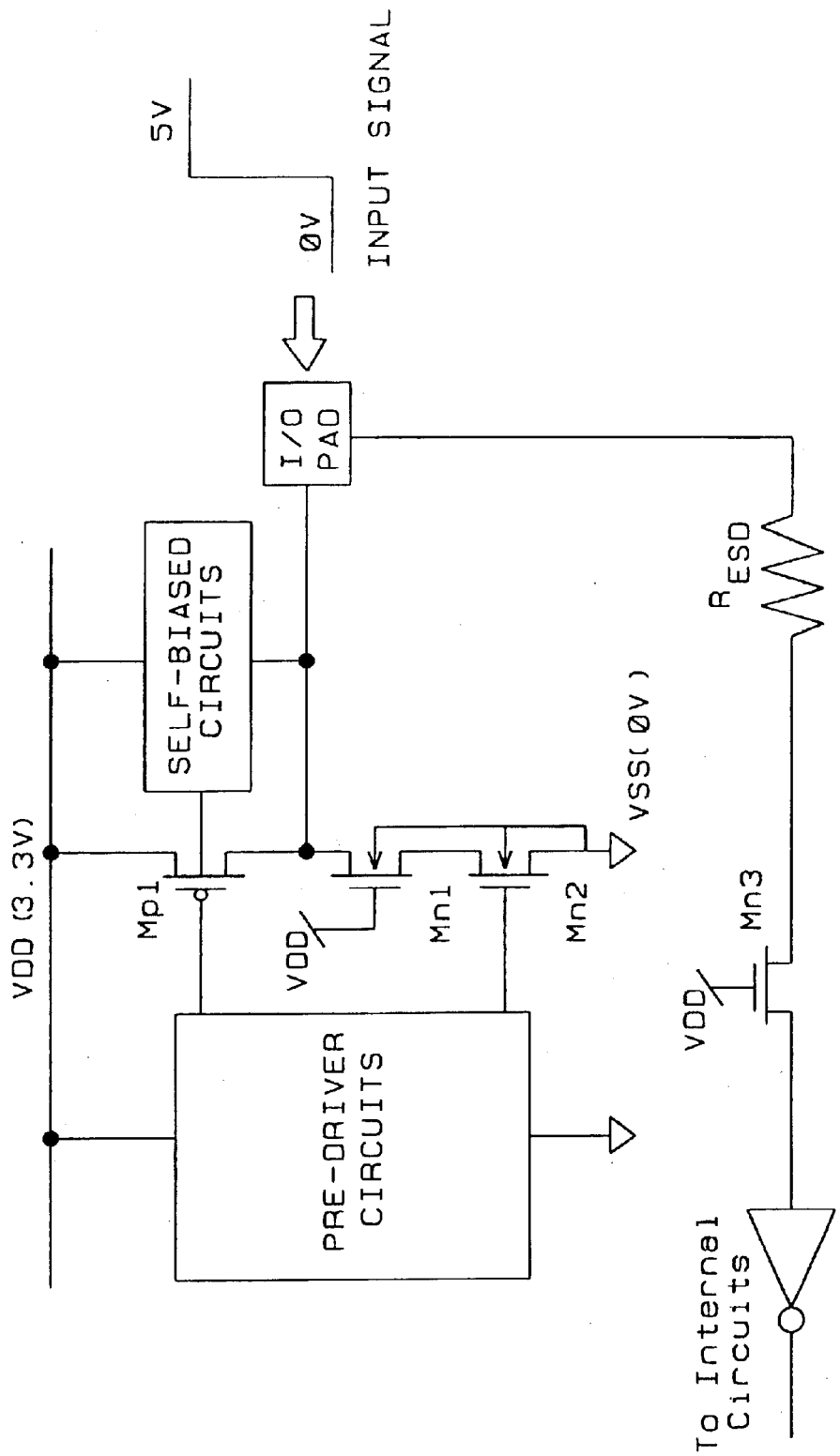

The typical circuit design for the 3/5V tolerant I/O pad is shown in FIG. 16, where the output PMOS device Mp1 has a self-biased N-well to avoid the parasitic diode connection from the pad to VDD (3.3V). The output NMOS device has a stacked structure with Mn1 and Mn2. The gate of Mn1 is connected to VDD (3.3V) to avoid the gate-oxide wearout issue due to high voltage across the gates of Mn1 and Mn2 in the deep-submicron CMOS process with thinner gate oxide thickness. While the input signal from the pad has a 5V voltage level, the gate of Mn2 and Mp1 is biased by the predriver circuits at the voltage levels which can turn off the Mn2 and Mp1 to keep the output buffer off during operation in the tri-state condition.

The high-voltage input signal is conducted to the internal circuits through the $R_{ESD}$ and the NMOS device Mn3. The NMOS device Mn3 is used to clamp the voltage level that reaches to the thinner gate oxide of the input circuits without the gate-oxide wearout issue. Such a circuit design is typically used in the CMOS IC devices those have the 3.3V VDD power supply but have to access the input signals with 5V voltage level. If the ESD implantation method to generate a lower junction breakdown voltage at the drain region is used on the output Mn1 and Mn2 devices to improve their ESD levels, the lower breakdown-voltage drain junction may cause a higher leakage current from the I/O pad to ground through the off-state Mn1 device. The junction breakdown voltage of the output NMOS device in a 0.35 $\mu$m 3.3V CMOS process is typically about 6V with the additional ESD implantation. Such an NMOS device with a lower junction breakdown voltage biased at 5V voltage level often has a significant leakage current greater than 1 $\mu$A, because the lower junction breakdown voltage (about 6V) is close to the bias voltage level. Thus, it is not safe enough to be used widely in the high-voltage-tolerant I/O circuits with the consideration on the process variation.

(f) BRIEF SUMMARY OF THE INVENTION

In accordance with this invention device is provided which was manufactured using an ESD implantation method with a light-doping concentration for ESD protection in the output and/or input circuits. The doping profile of the ESD implantation is deep enough to cover the drain diffusion implantation.

In accordance with this invention, the ESD implantation comprises an ESD implantation with a lightly-doped concentration in the ESD regions of ESD-protection devices. Preferably, the ESD implantation of a lightly-doped concentration for ESD protection is provided in a selected one of the output and input circuits. The ESD implantation doping profile of the ESD implantation is deep enough to cover surfaces of the drain diffusion implantation within the substrate, aside from a central region, and/or within the substrate aside from a central region below a drain contact. The device is selected from the group consisting of NMOS, PMOS, field-oxide, and diode devices.

Preferably, the ESD protection is provided only in the drain region of the ESD-protection NMOS/PMOS devices and/or the ESD protection is provided in the output/input circuits. Preferably, the ESD implantation step follows a lightly doped source/drain (LDD) implantation and precedes formation of sidewall spacers adjacent to gate electrode stacks of a gate electrode above a gate oxide layer. Preferably the device includes a substrate with a FOX oxide layer which is patterned as FOX regions. A gate-oxide and gate-poly layer and patterned gate electrode stacks are provided.

An LDD ion implantation is formed deeper than ultimate depths of source/drain regions in the substrate. Exposed surfaces have been covered with a Low-Temperature Oxide and etched to form sidewall spacers. A diffusion implantation of source/drain regions has been provided. A diffusion implantation of counterdoped regions has been provided between the source/drain regions and the FOX regions. CVD/LTO and etch contact holes have been formed.

In accordance with this invention an ESD implantation device comprises an ESD implantation with a lightly-doped concentration in the ESD regions of ESD-protection devices. The ESD implantation regions of lightly-doped concentration for ESD protection are provided in a selected one of the output and input circuits. The ESD implantation doping profile of the ESD implantation is deep enough to cover surfaces of the drain diffusion implantation within the substrate. The ESD implantation doping profile of the ESD implantation is deep enough to cover surfaces of the drain diffusion implantation within the substrate aside from a central region. The ESD implantation doping profile of the ESD implantation is deep enough to cover surfaces of the drain diffusion implantation within the substrate aside from a central region below a drain contact.

Preferably, the device is selected from the group consisting of NMOS, PMOS, field-oxide, and diode devices; ESD protection is provided only the drain region of the ESD-protection NMOS/PMOS device, and ESD protection is provided in the output/input circuits.

Preferably the ESD implantation follows a lightly doped source/drain (LDD) implantation and precedes formation of sidewall spacers adjacent to gate electrode stacks of a gate electrode above a gate oxide layer.

Preferably, the device comprises a substrate with a FOX oxide layer which is patterned as FOX regions, a gate-oxide and gate-poly layer and patterned gate electrode stacks. There are LDD ion implantations deeper than ultimate depths of source/drain regions in the substrate. A Low-Temperature Oxide was formed and etched to form sidewall spacers. There are diffusion/implanted source/drain regions, diffusion/implanted counterdoped regions between to the source/drain regions and the FOX regions, and CVD/LTO etched contact holes.

(g) BRIEF DESCRIPTION OF THE SEVERAL VIEWS OF THE DRAWINGS

The above and other aspects and advantages of this invention are described with reference to the accompanying drawings wherein:

FIG. 1 is a flowchart of the Prior Art I process.

FIGS. 2A–2H are cross-sectional views showing the Prior Art I process flow of FIG. 1, with the left-hand portions of the drawings showing the ESD protection devices and the right-hand portions of the drawings showing the internal devices.

FIG. 3 is a flow chart of a typical Prior Art II method.

FIGS. 4A–4H show the cross-sectional views of the step-by-step process flow of the Prior Art II process of FIG. 3, with the left-hand portions of the drawings showing the ESD protection devices and the right-hand portions of the drawings showing the internal devices.

FIG. 5 is a process flow chart in accordance with this invention for high-voltage-tolerant I/O devices.

FIGS. 6A–6H illustrate cross-sectional views of ESD protection NMOS devices and internal NMOS devices in accordance with this invention which illustrates the results of the steps of FIG. 5, with the left-hand portions of the drawings showing the ESD protection devices and the right-hand portions of the drawings showing the internal devices.

FIG. 7 shows the structure of an output NMOS device.

FIG. 8 shows the top layout view of the device of FIG. 7.

FIG. 9 shows the I-V characteristics of the device of FIG. 7.

Figure 10:
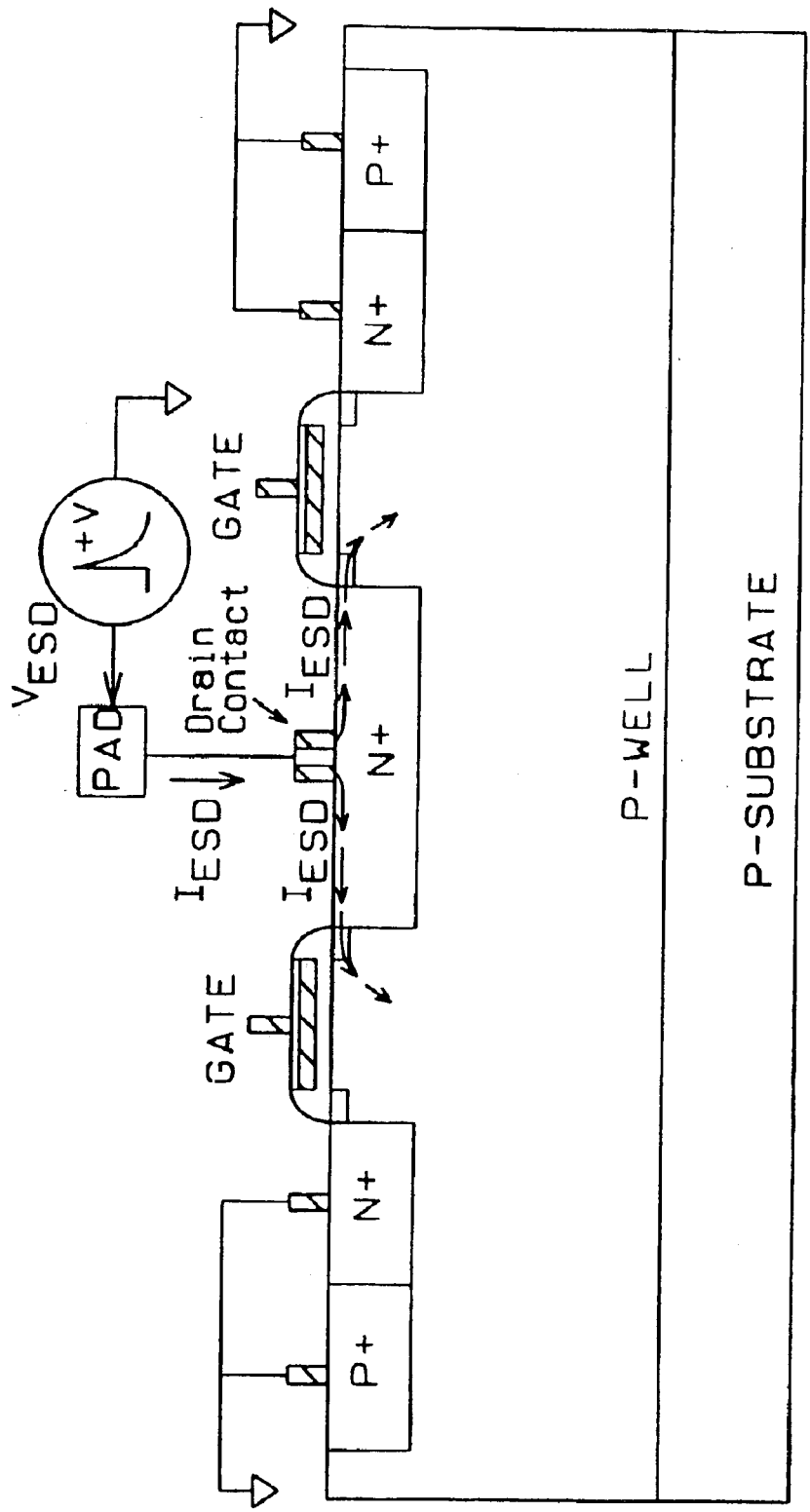

FIG. 10 shows the ESD current path on the NMOS device with LDD structure.

FIG. 11 shows the LDD peak in the NMOS device has been covered or removed by the ESD implantation with an extra N+ region.

Figure 12:
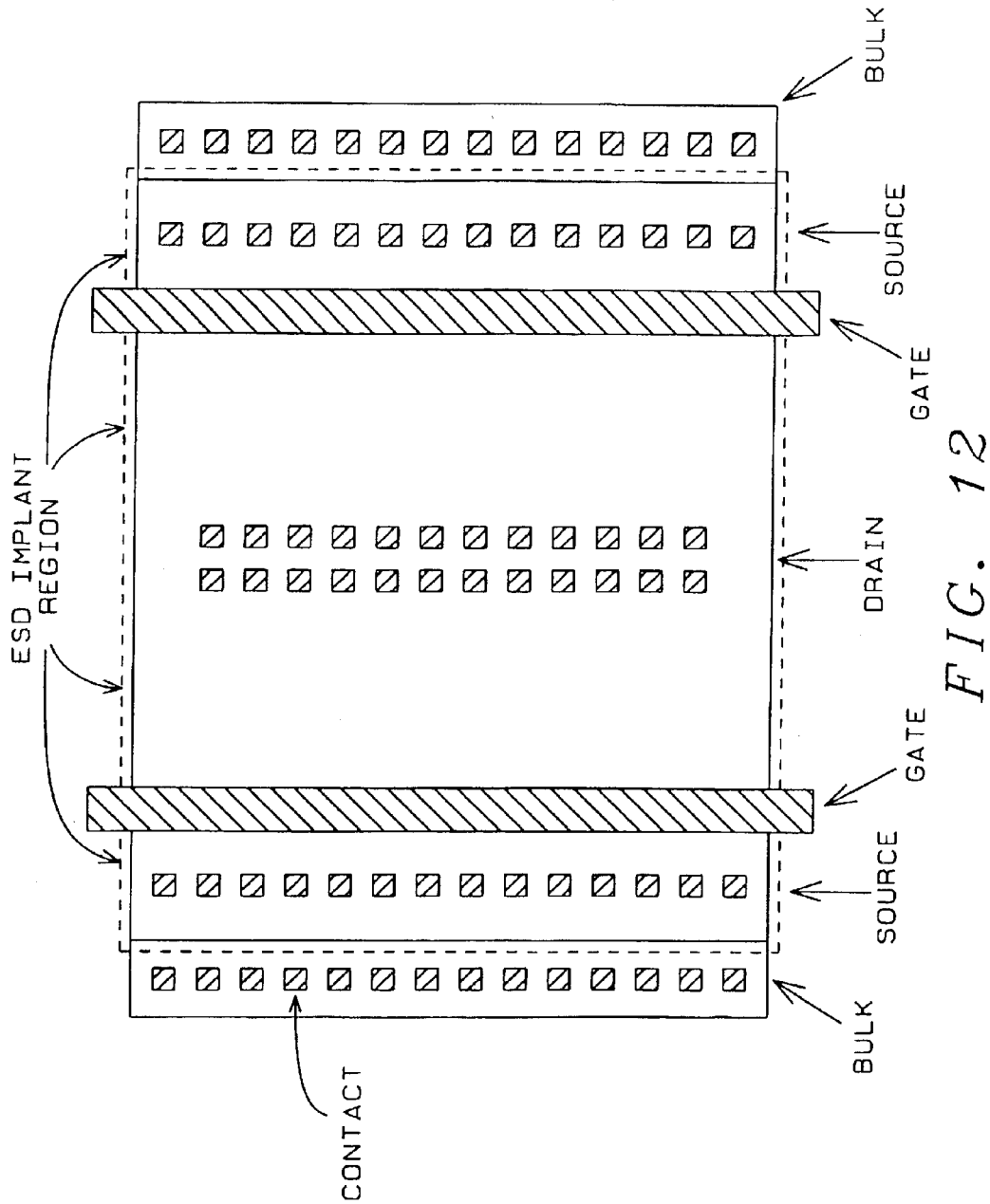

FIG. 12 shows the typical top view of layout to make the NMOS device without LDD peak structure.

FIG. 13 shows a high concentration of an N++ dopant material implanted around the junction under the drain contact to reduce the breakdown voltage around this junction region.

FIG. 14 shows a high concentration of a P+ dopant material implanted around the junction under the drain contact to reduce the breakdown voltage around this junction region.

Figure 15:
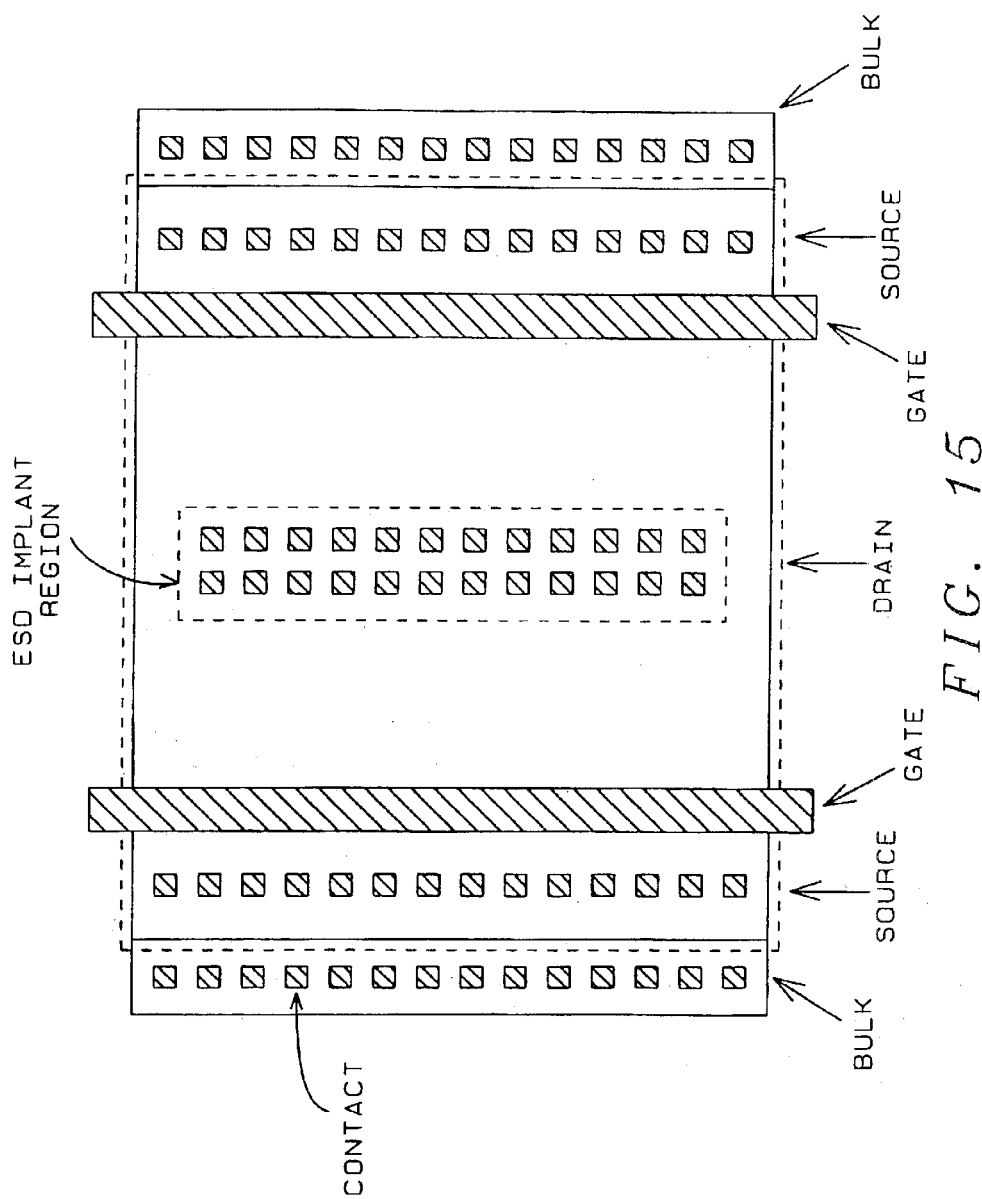

FIG. 15 shows a layout for realization of the methods of FIG. 13 and FIG. 14, where the ESD implantation region is located only at the center of the drain region including the junction under the drain contact.

FIG. 16 shows the typical circuit design for a 3V/5V tolerant I/O pad where the output PMOS device has a self-biased N-well to avoid the parasitic diode connection from the pad to VDD (3.3V).

Figure 17:
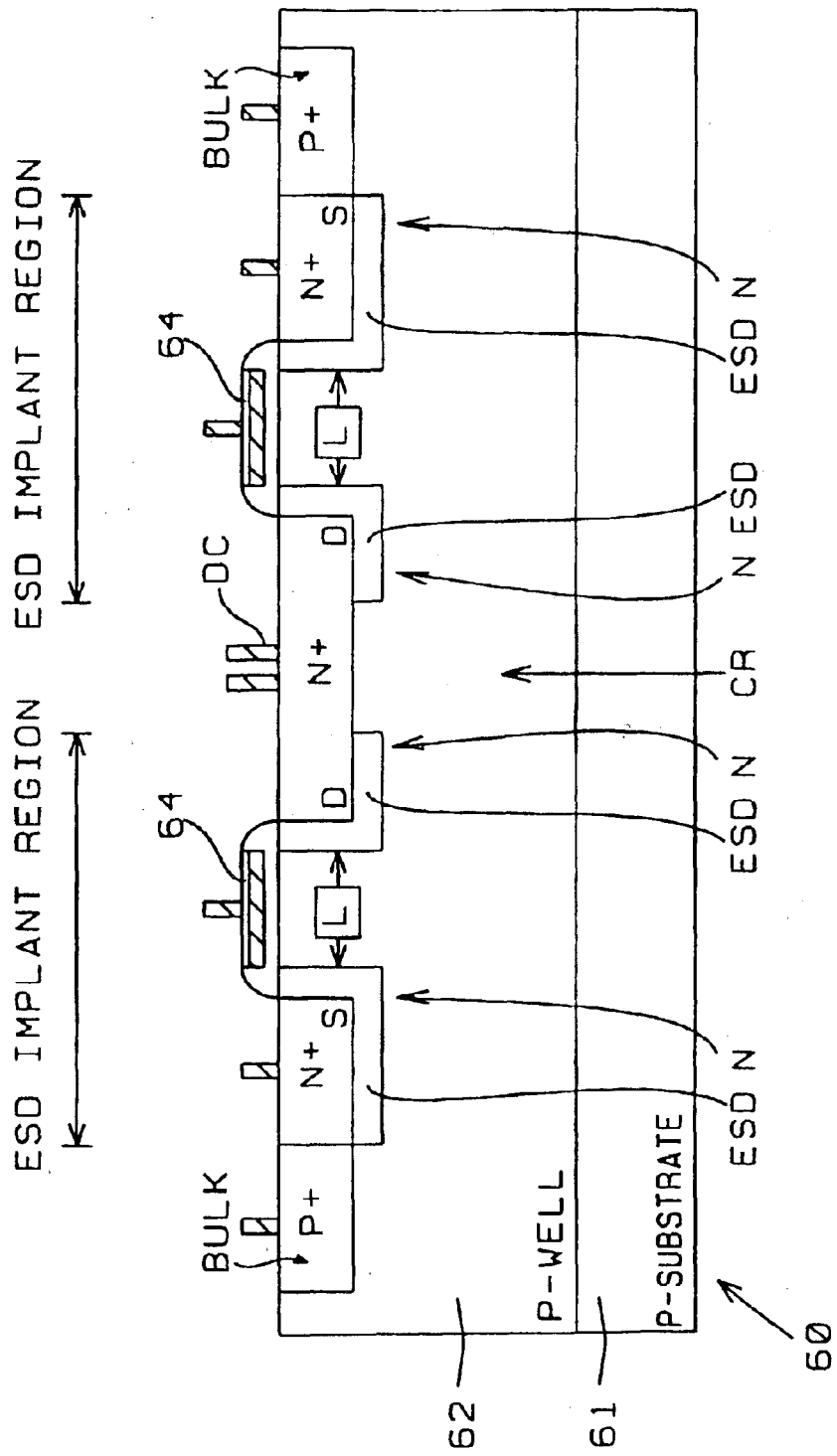

FIG. 17 shows the ESD implantation of this invention on the NMOS device for high-voltage-tolerant I/O circuit applications.

Figure 18:
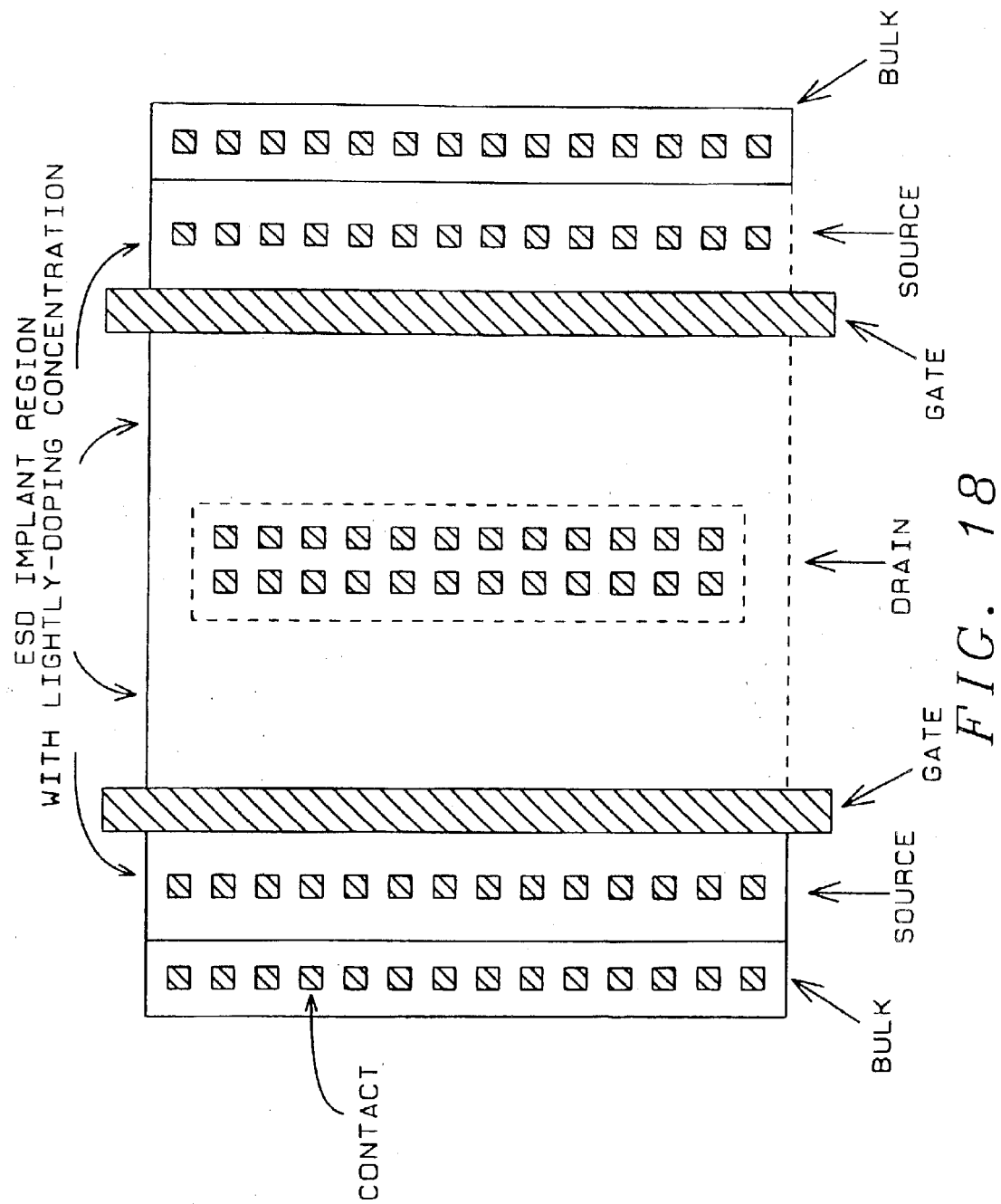

FIG. 18 illustrates the corresponding layout for the device of FIG. 17.

Figure 19:
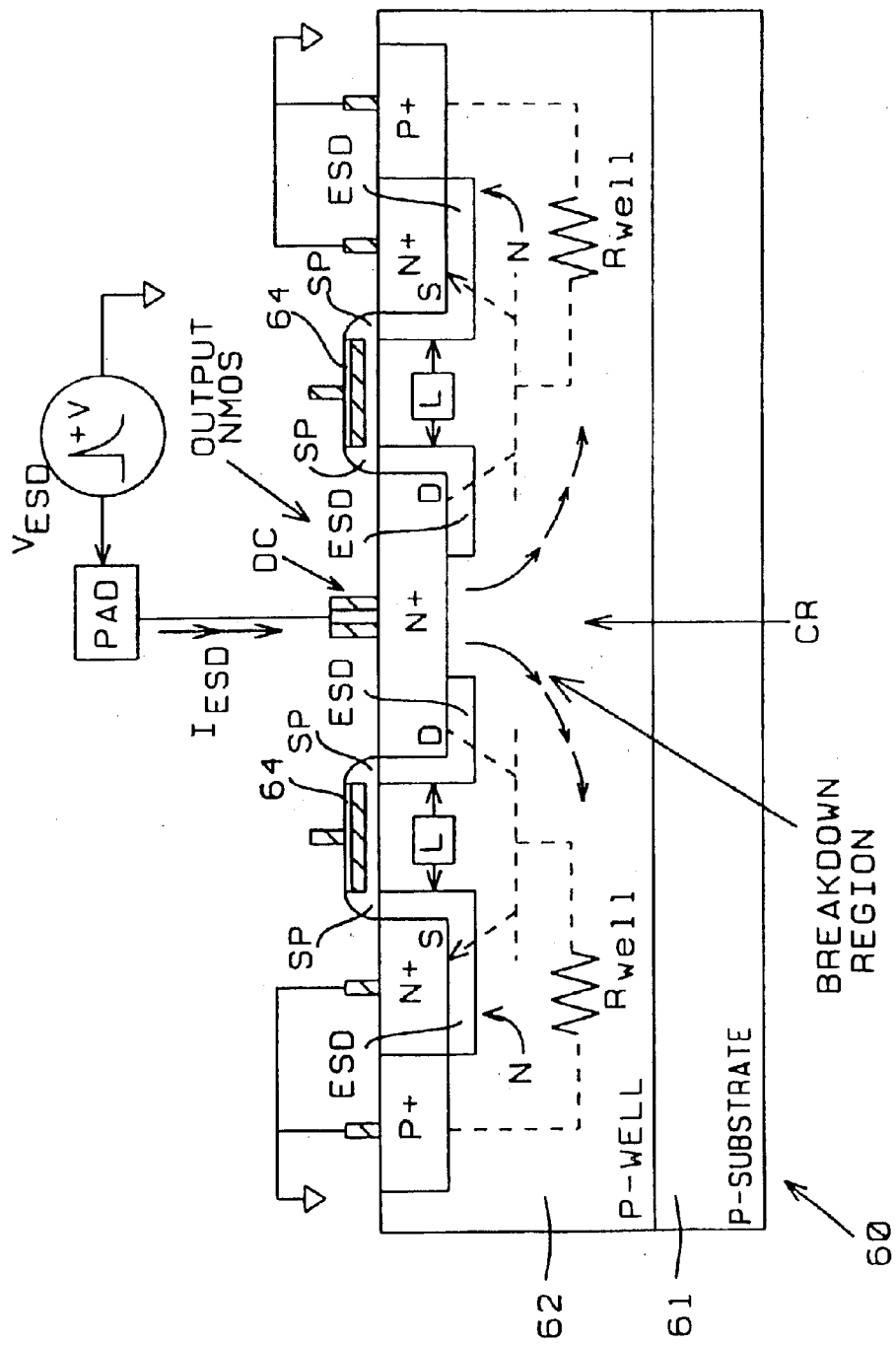

FIG. 19 shows the ESD current path of the ESD-implantation NMOS device of FIG. 17.

Figure 20:
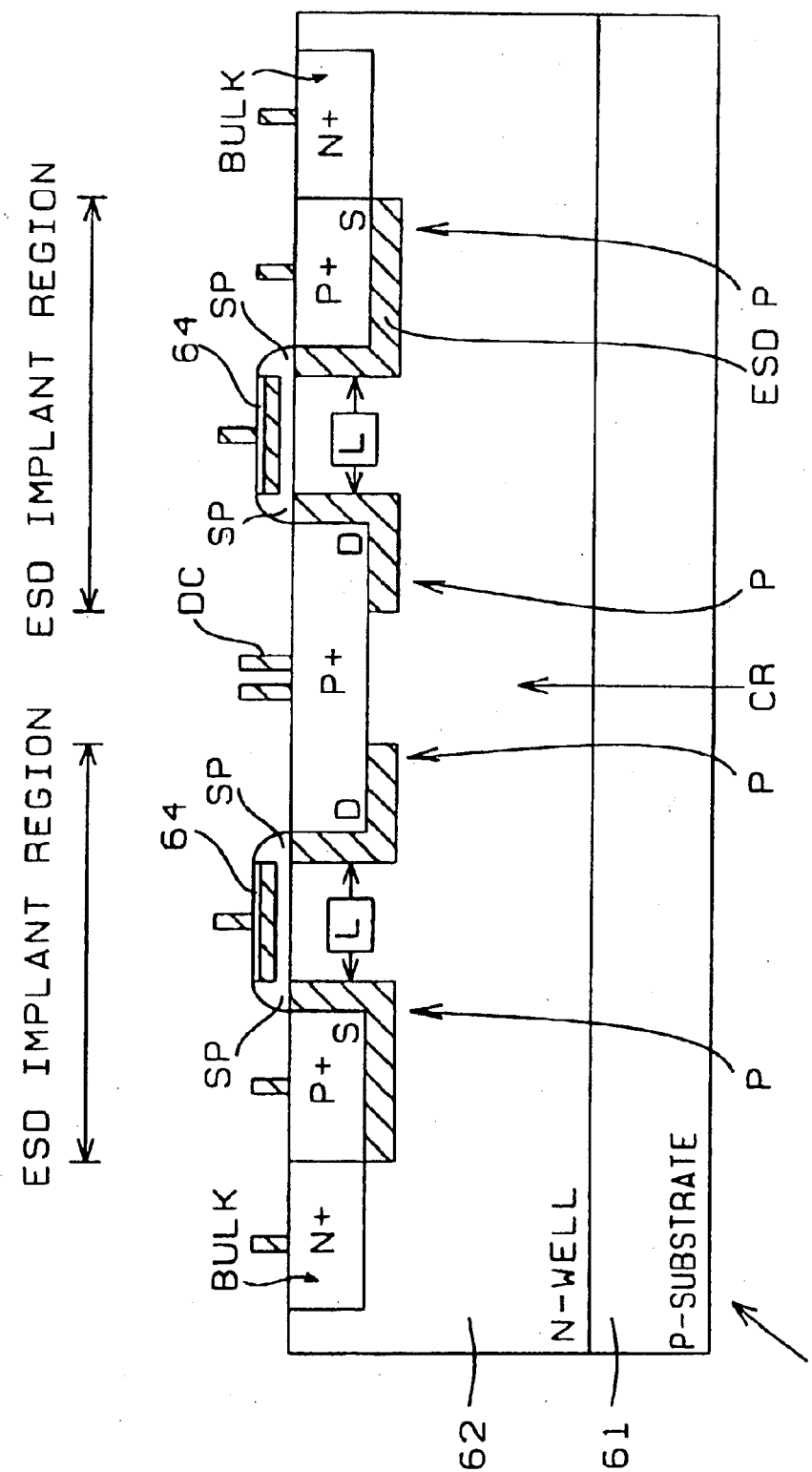

FIG. 20 shows the ESD implantation on the PMOS device, where the whole PMOS device is covered by the light doping P region, under the P+ diffusion, except for the junction region under the drain contact.

Figure 21:
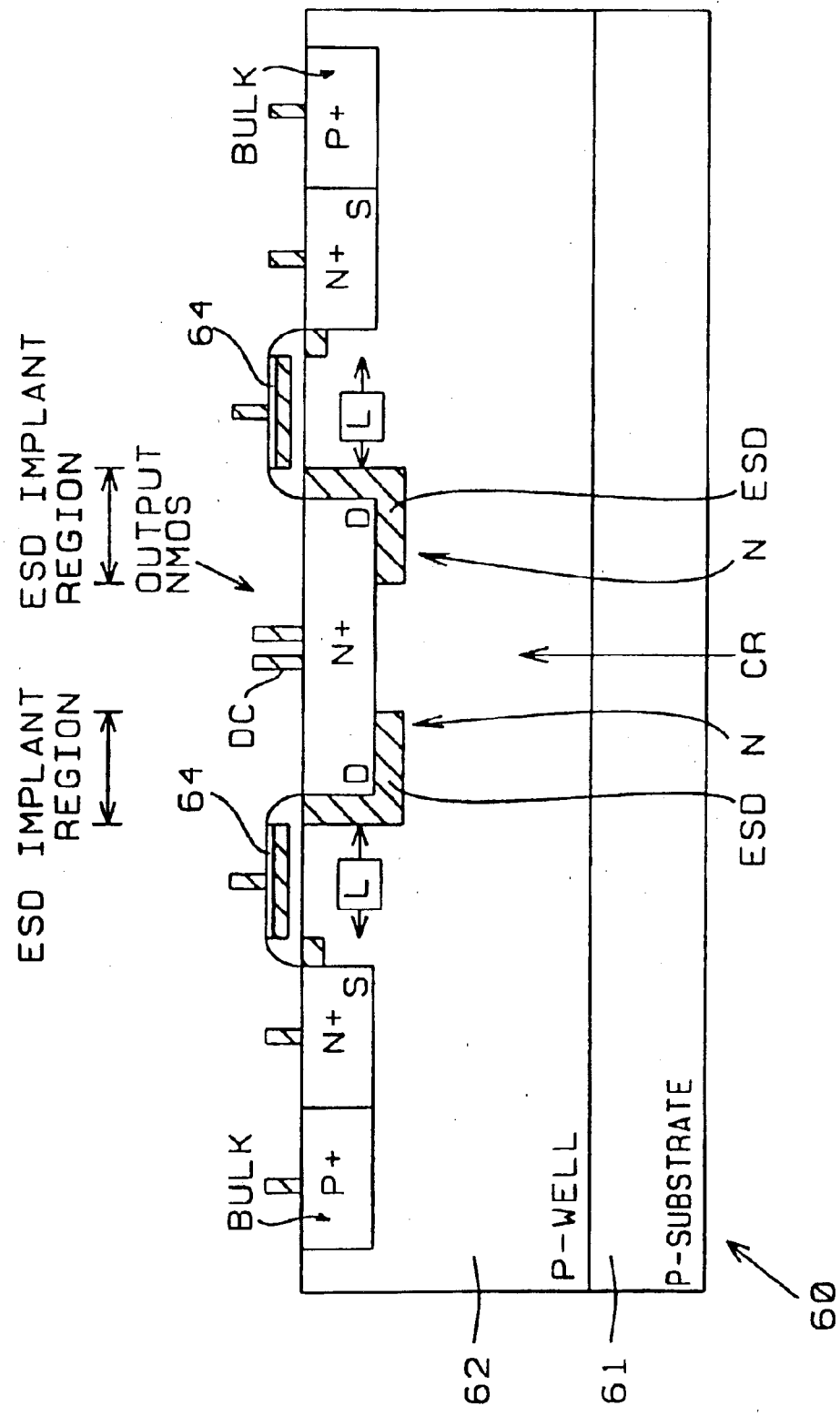

FIG. 21 shows a modified design for an NMOS device with an N-well formed in the substrate showing the ESD implantation method of this invention applied only to the drain region of the output NMOS device on either side of the center region.

Figure 22:
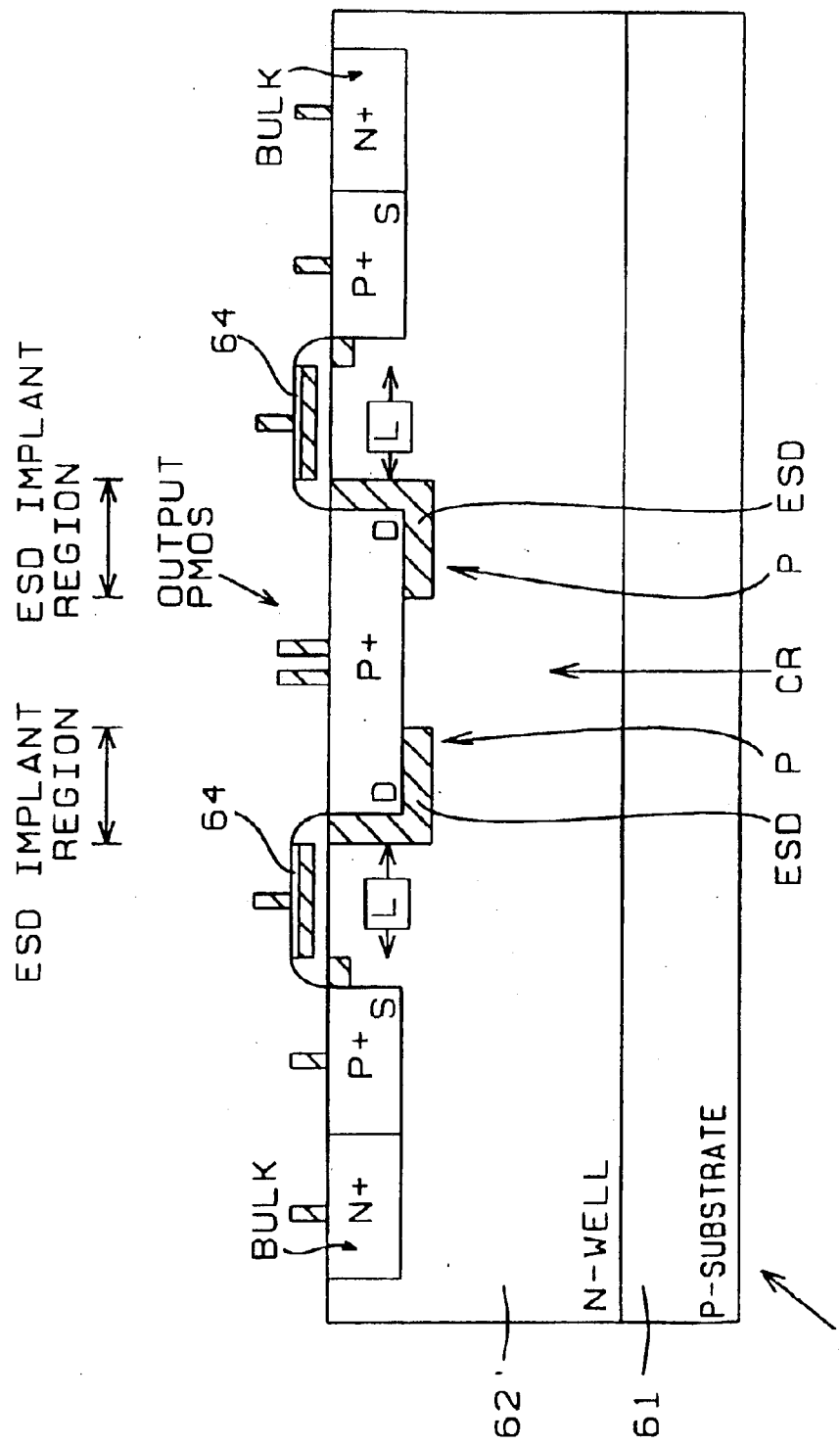

FIG. 22 shows a modified design for a PMOS device with an N-well and P+ source/drain regions S/D and P-doped LD-ESD regions ESD formed in a substrate showing the ESD implantation method of this invention applied only to the drain region of the output PMOS device on either side of the center region.

Figure 23:
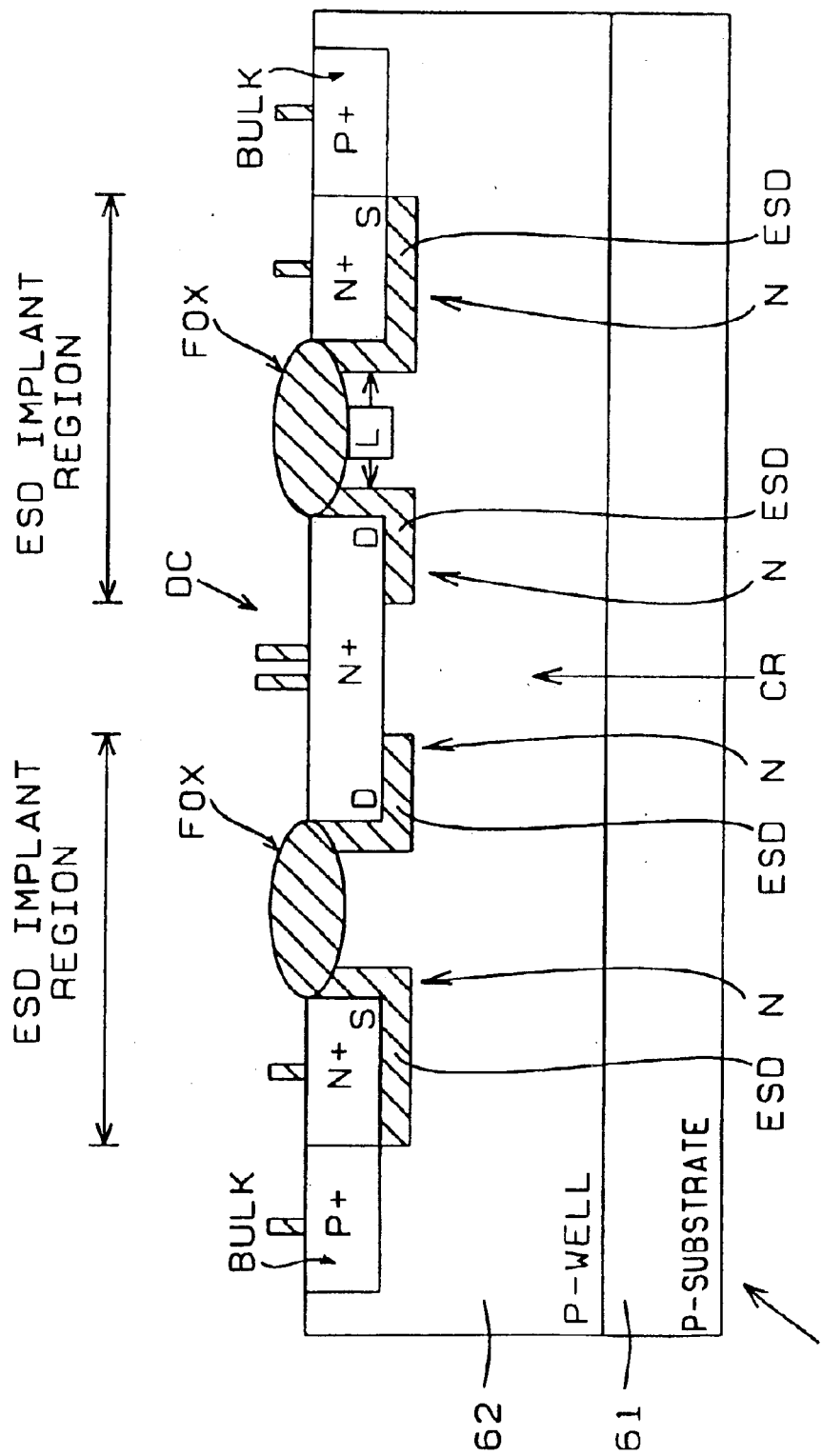

FIG. 23 shows the applications of this invention on an N-type Field-Oxide Device (FOD).

Figure 24:
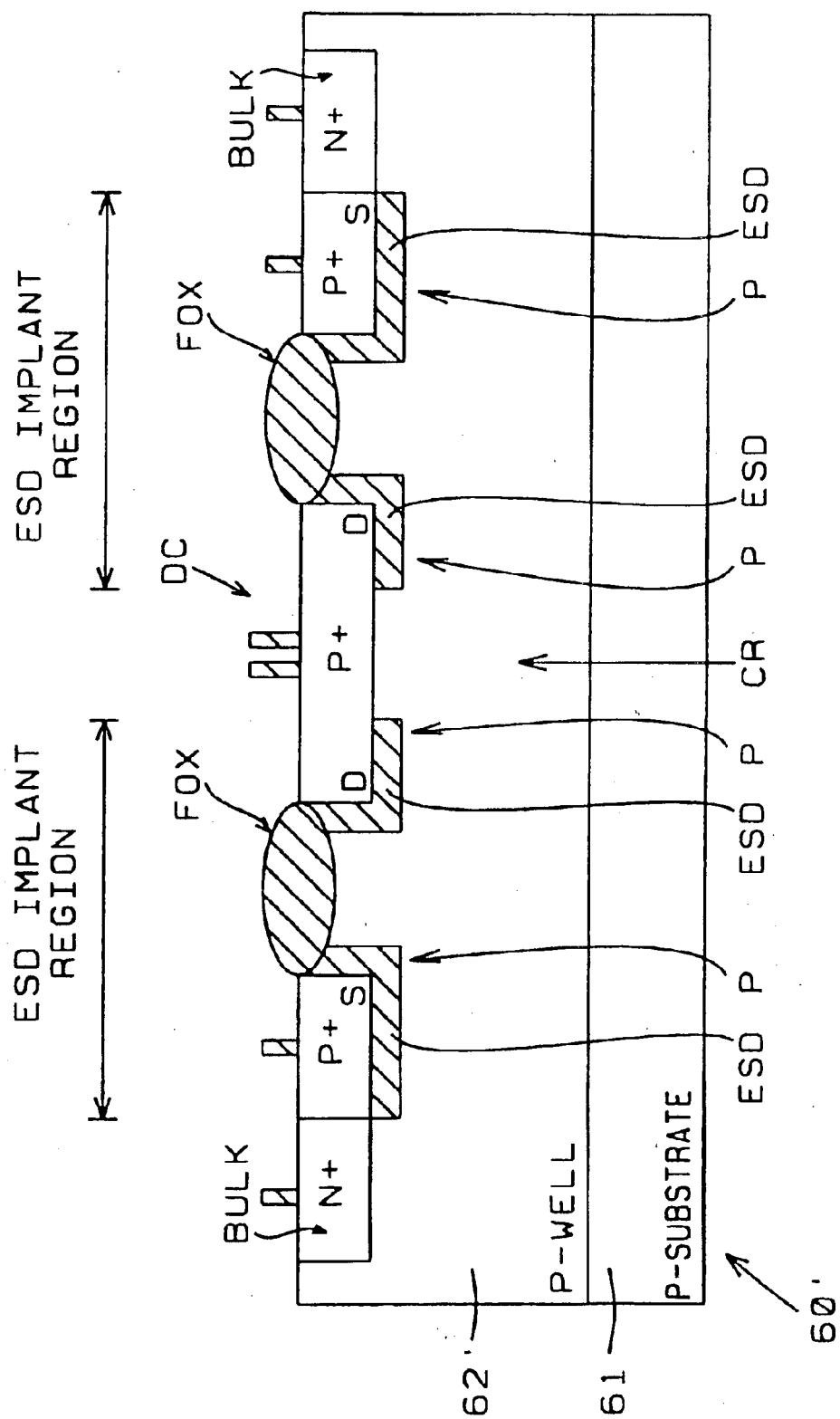

FIG. 24 shows the applications of this invention on the P-type FOD, and P-type FOD are illustrated in and FIG. 24, respectively.

Figure 25:
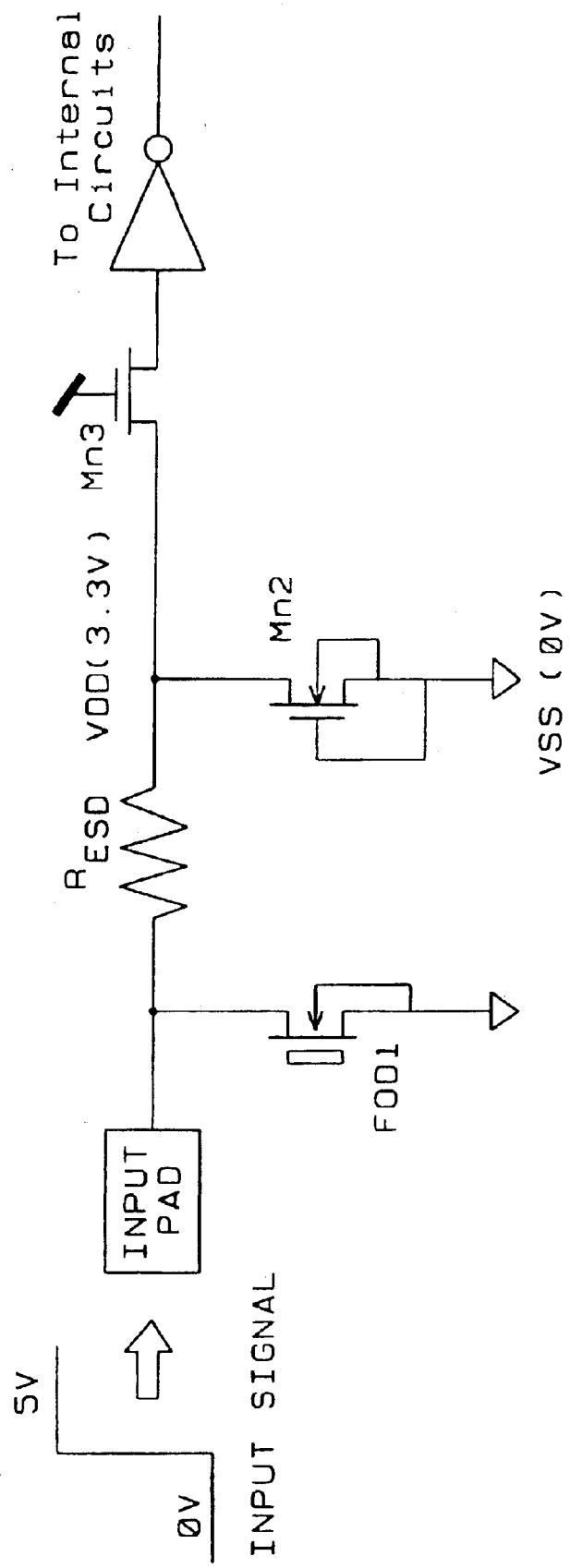

FIG. 25. shows a similar effect of this invention applied in a P-type FOD to increase ESD Robustness of the P-type FOD in CMOS technologies.

Figure 26:
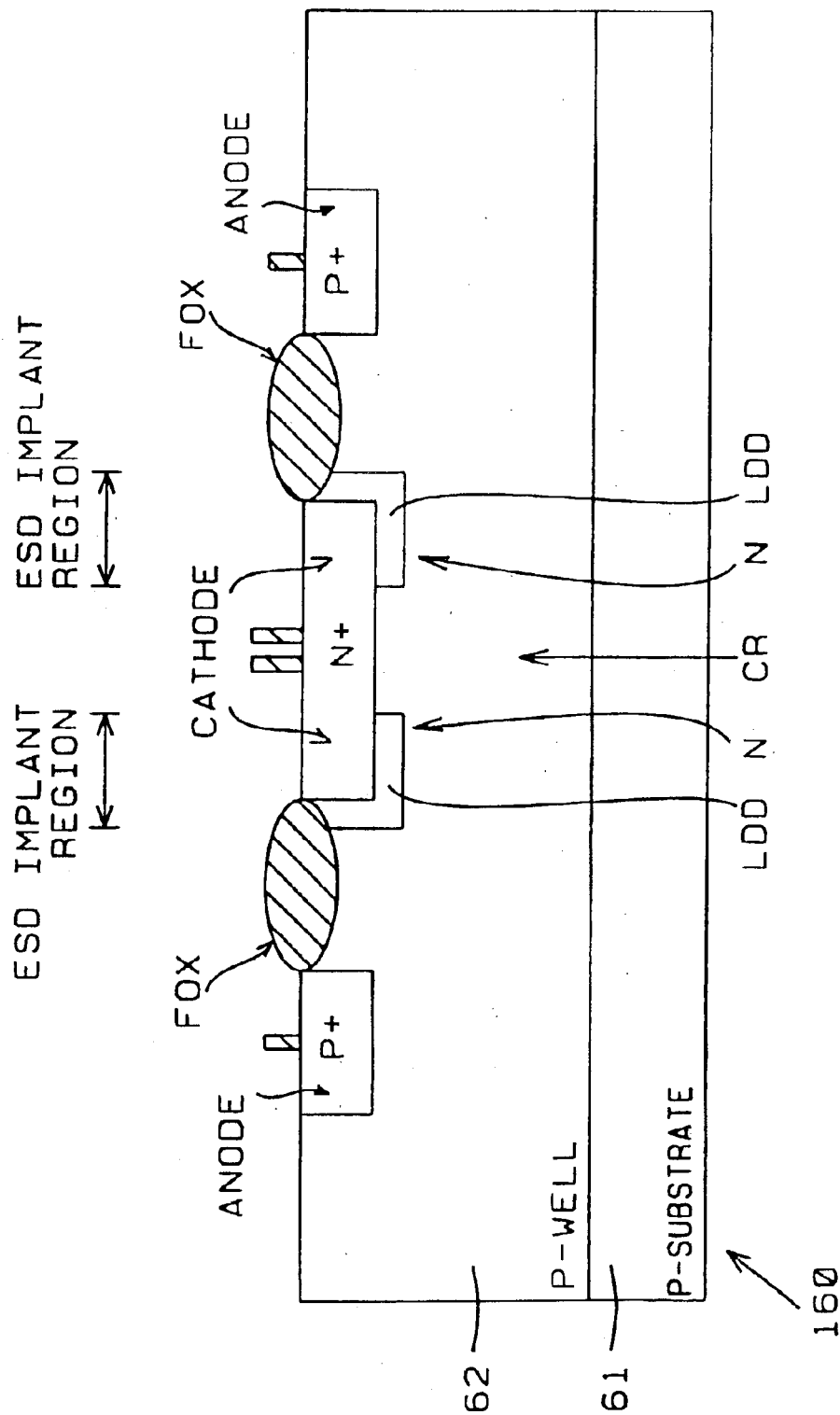

FIG. 26 shows use of ESD implantation with a light doping concentration increasing the junction breakdown voltage of the specially selected junction region is also applied to an ESD protection diode with a diode formed in the P-well of a CMOS process with the P-type substrate, so the diode cathode is the N+ diffusion junction region connected to the pad.

Figure 27:
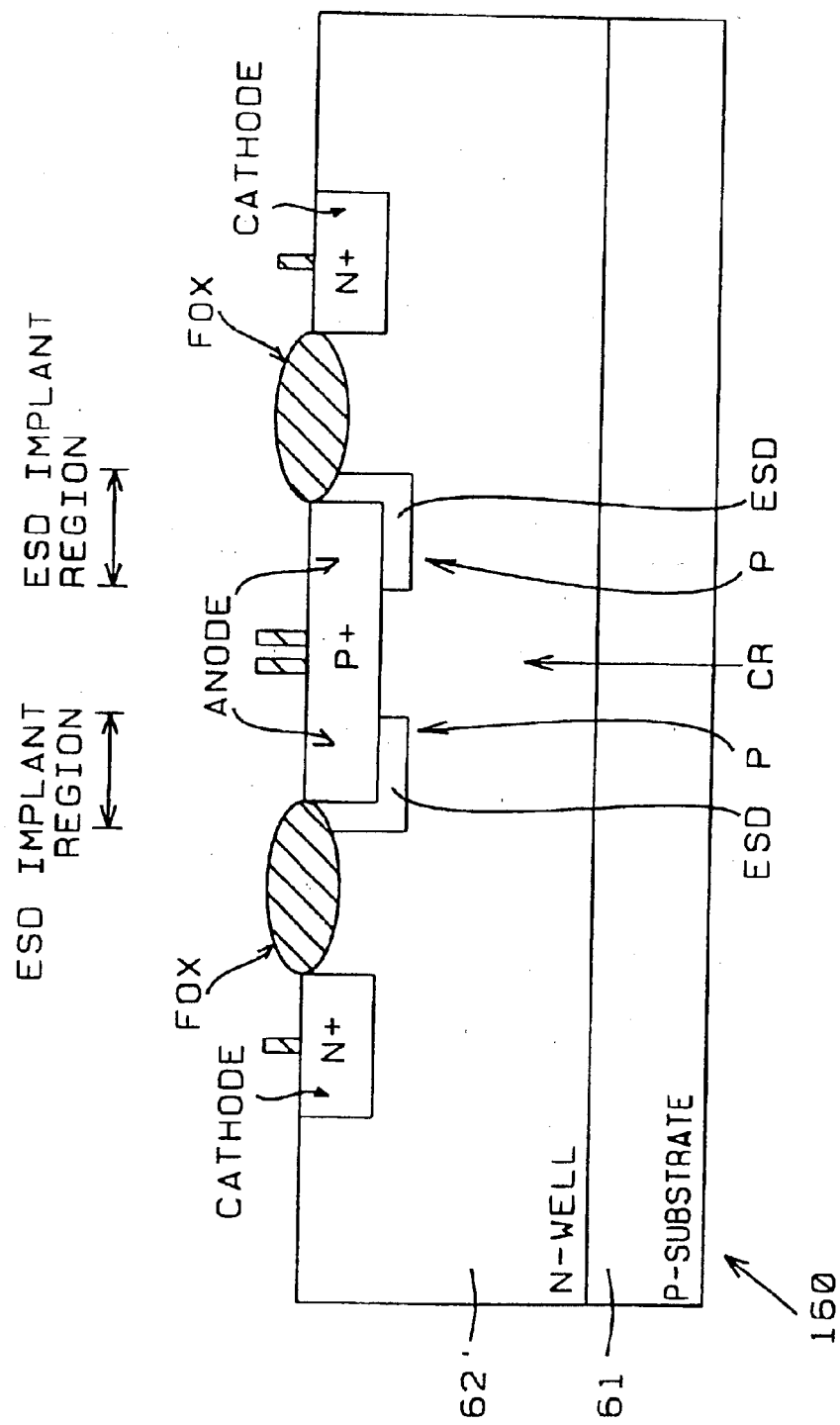

FIG. 27 illustrates use of ESD implantation with a light doping concentration to increase the junction breakdown voltage of the specially selected junction region is also applied to a diode for ESD protection with the diode formed in the N-well of a CMOS process with the P-type substrate, so that the diode cathode is the N+ diffusion junction region connected to the pad.

Figure 28:
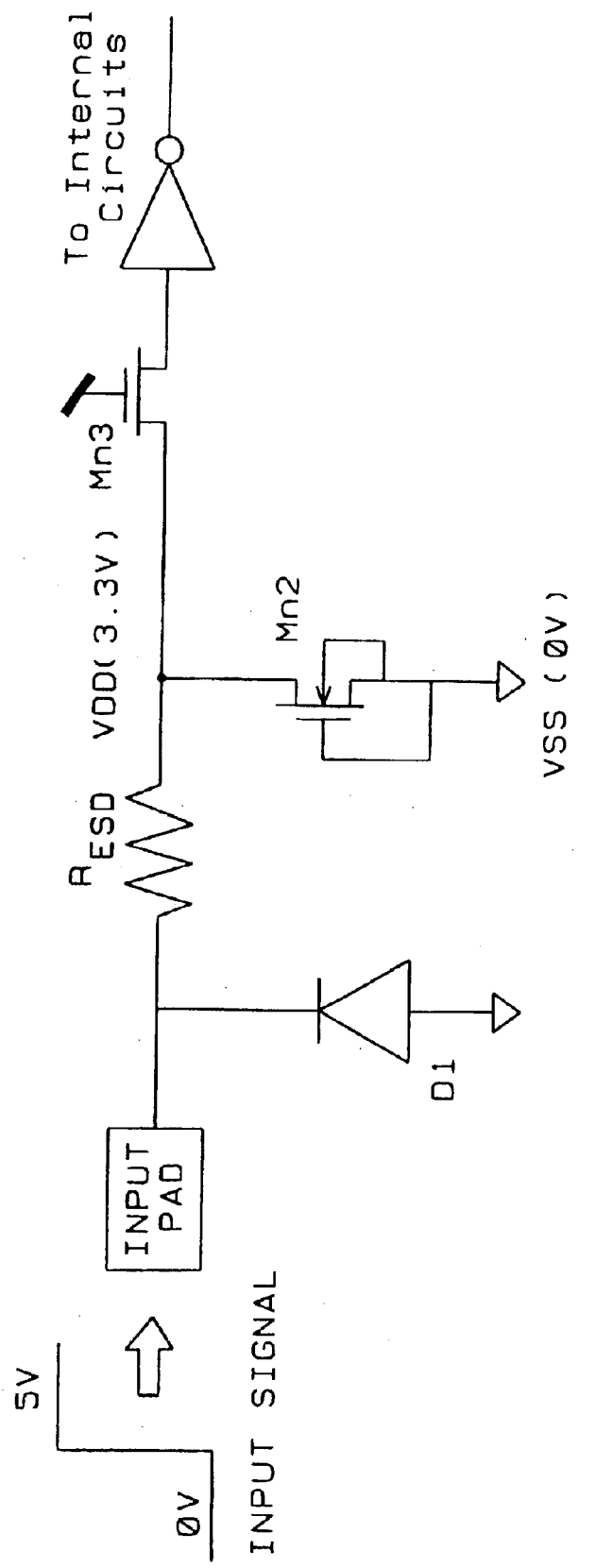

FIG. 28 shows the application of the diode with the ESD implantation of this invention in the input ESD protection circuit for a 3V/5V tolerant input pin.

DESCRIPTION OF THE PREFERRED EMBODIMENT

FIG. 5 is a process flow chart in accordance with this invention for high-voltage-tolerant I/O devices. FIGS. 6A–6H illustrate cross-sectional views of ESD protection NMOS devices and internal NMOS devices in accordance with this invention which show the results of the steps of FIG. 5.

FIG. 5 shows a flowchart of a process in accordance with this invention for forming a device 60 by the steps illustrated by FIGS. 6A–6H.

FIGS. 6A–6H are cross-sectional views of the FIG. 5 process flow in which the left-hand portions of FIGS. 6A–6H show the ESD protection devices and the right-hand portions of FIGS. 6A–6H show the internal devices.

In FIG. 6A, a substrate 61 is shown with Field Oxide (FOX) regions 63 formed on the surface of a P-well 62 which frame ESD protection device region ESD and Internal Device region ID. The process of FIG. 5 starts with device 60 formed on substrate 61 including P-well 62 as shown in FIG. 6A with an ESD-Protection-Device portion ESD on the left and an internal device portion ID on the right. Referring again to FIG. 5, the first step 50, as shown by FIG. 6A, is to provide a set of field oxide (FOX) regions 63 on the surface of the P-well 62 to frame the ESD protection device region ESD and the internal device region ID.

The next step 51 is to form a gate-oxide layer GOX and a gate electrode layer of doped conductive poly, that is patterned into gate electrodes 64 by a patterned photoresist mask PR1, as that shown in FIG. 6B Then mask PR1 is stripped away from the device 60.

Figure 6C:
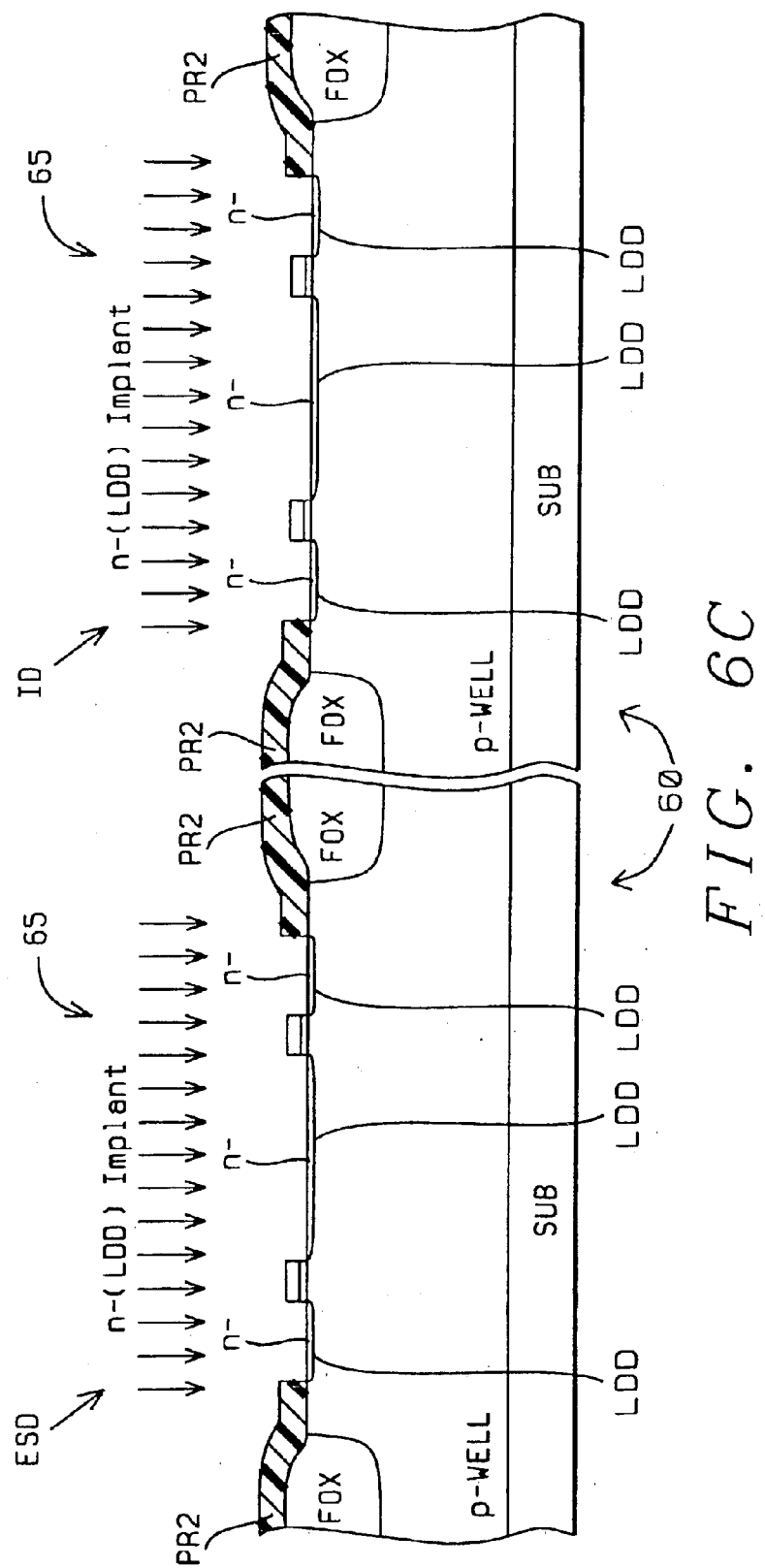

The next step 52 illustrated in FIG. 6C is to perform an implantation of dopant regions LDD (Lightly Doped Drain) in the surface of the P-well 62 self-aligned with the gate electrodes 64, aside therefrom. Then the mask PR2 is stripped away from the device 60.

Figure 6D:
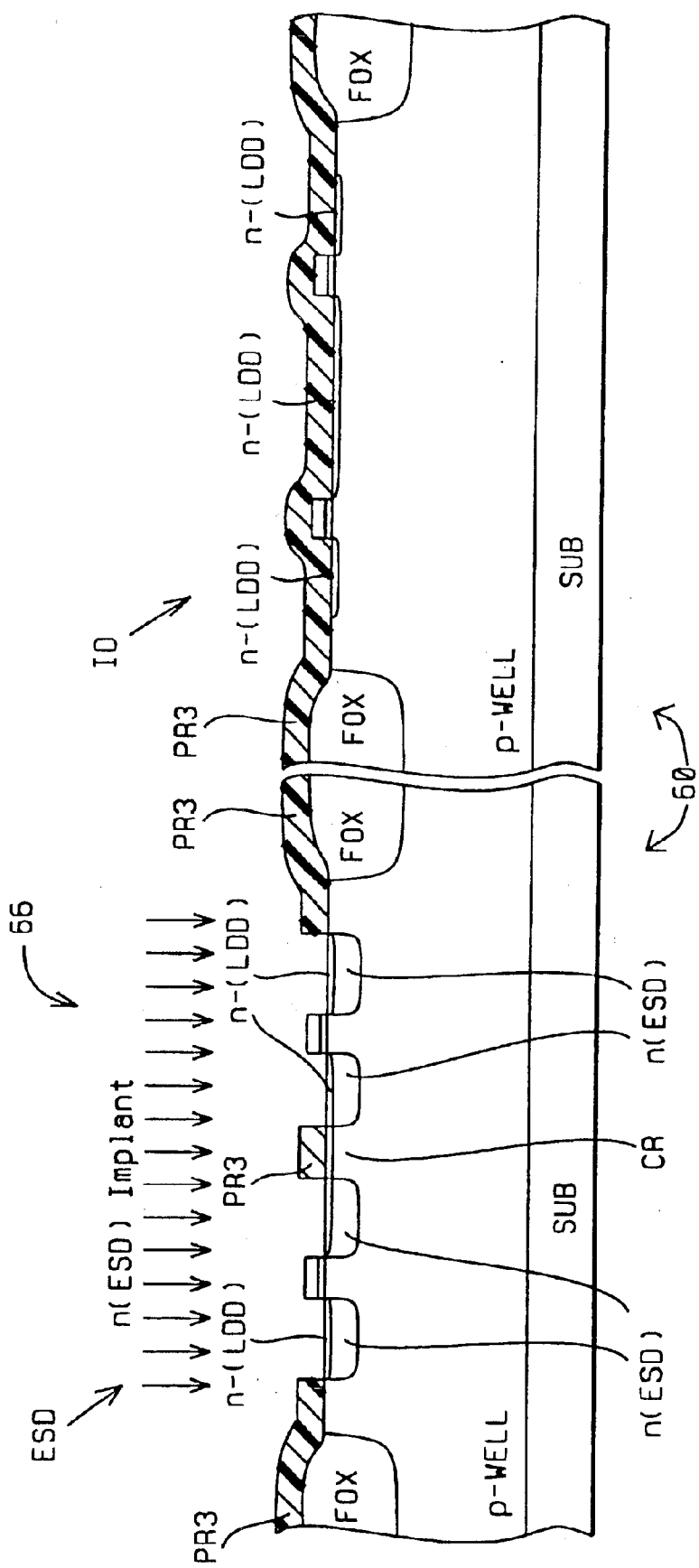

In step 53, as shown in FIG. 6D, an ESD implantation with a lightly-doping-concentration ions is deeply implanted into the selected area, which is defined by a photoresist mask PR3. The ESD implantation mask PR3 is formed covering the entire internal device ID portion of device 60, the FOX regions 63 and center region CR in the center of the ESD-Protection-Device portion ESD. Thus the photoresist mask PR3 covers all the area of the wafer except for the selected area of the ESD protection devices as shown in FIG. 6D. This ESD implantation which is different from the prior art process is performed with N-type dopant 66 which is ion implanted a lightly-doping LD-ESD concentration but a Deeper Junction Depth (DJD) than in the prior art shown in FIG. 2D where a Heavily Doped ESD Implantation was used. The Deeper Junction Depth (DJD) of the LD-ESD region is achieved with a higher energy employed during the ion implantation process. Then the mask PR3 is stripped away from the device 60. In this invention, the ESD implantation with a lightly doping concentration is different from that of the Prior Art I in FIGS. 2A–2H.

The heavily doping concentration in the Prior Art I is normally $1-7 \times 10^3$ ions/cm$^2$ of arsenic is used for the ESD implantation as shown in FIG. 2D.

In FIG. 6D, the drain center region CR is not implanted by the LD-ESD ions 66. In summary, in the LD-ESD step 53 the junction depth of this ESD-implantation doping profile must be deeper than that of the drain/source diffusions in the following process of drain/source diffusion implantation. After the forming of the ESD implantation in accordance with this invention, photoresist mask PR3 is removed. In step 53 only a dopant concentration smaller than that of the drain/source N+ diffusion in the normal NMOS device (internal devices) is employed.

In step 54, a Low-Temperature Oxide (LTO) is formed to cover the entire wafer. The unwanted portion of the LTO is removed by with an anisotropic plasma (dry) etching to create the sidewalls on the poly gate electrodes 64, as shown in FIG. 6E. As shown in FIG. 6E, at the end of step 54 the sidewalls of the gate electrodes 64 are covered with sidewall spacers SP that are composed of the LTO silicon oxide. The spacers SP remain adjacent to the gate electrodes 64.

In the drain/source formation process step 55, as shown in FIG. 6F, an arsenic implant is used to dope drain/source regions. Step 55 commences with the formation of a drain/source implantation photoresist mask PR4 over the FOX regions and adjacent thereto above the P-well 62 to define the doping region for the drain/source diffusion, as shown in FIG. 6F. Step 55 involves the usual N+ diffusion implantation process starting with an ion implantation process which forms N+ regions self-aligned with the spacers SP/gate electrodes 64 followed by an N+ Diffusion step to diffuse the N+ dopant into the N+ doped regions. A higher doping concentration, more than $1 \times 10^{15}$ ions/cm$^2$, is used to form the drain and source regions of the devices. Then mask PR4 is stripped away.

In step 56, as shown in FIG. 6G, after the drain/source implantation process, a mask PR5 is formed and then P+ diffusion implantation step is performed. Step 56 enhances the P+ dopant aside from the N doped regions in the P-well between the FOX regions 63 and the mask PR5 which is formed over the N+ source/drain regions, the LDD N-doped regions and the n(ESD) regions. Then mask PR5 is stripped away.

As shown in FIG. 6H, in step 57 a CVD LTO process deposits silicon oxide followed by etching of contact holes CH therethrough down to the central region source/drain regions including region CR and the lateral P+ diffusion regions. Contact hole etching is used to define the drain/source contact holes for both the ESD protection device and the internal devices.

In this invention, the ESD-implantation regions are located at the output NMOS or PMOS devices, but without covering the region under the drain contact. The ESD implantation process of this invention results in a lightly-doping concentration. Thus, regions with this ESD implantation have a higher junction breakdown voltage and a lower junction capacitance; but the region CR under the drain contact without this ESD implantation has an original junction breakdown voltage, so the ESD current discharges through the junction region under the drain contact CR to the bulk (substrate) P-well 62. The ESD discharging current path in the ESD protection device ESD is changed by the ESD-implantation method of this invention. Thus, the ESD level of the NMOS/PMOS device in the output buffer is improved significantly. Thus the ESD current is discharged far away from the surface channel region of the output NMOS or PMOS device. Thus, the output NMOS/PMOS devices can sustain a far higher ESD level. The original drain junction breakdown voltage of the output NMOS/PMOS device with the ESD implantation method of this invention is unchanged, which is still the same as that having no such ESD implantation, so it is used in the I/O circuits with high-voltage (5V) input signals in the CMOS IC with the 3.3V or 2.5V VDD for the internal circuits.

The ESD implantation of this invention on the NMOS device for high-voltage-tolerant I/O circuit applications is shown in FIG. 17, whereas its corresponding layout is illustrated in FIG. 18.

In FIG. 17, the ESD implantation region covers the whole NMOS device, but except the region around the drain contact. This ESD implantation region has a lighter doping concentration (N) than that of the original (N+) drain junction. Thus, the junction covered by the implantation method of this invention ESD has an increased junction breakdown voltage, because it has a lighter doping concentration across the P-N junction. However, the region without covering by this ESD implantation has the original junction breakdown voltage, which is lower than the junction breakdown voltage of the junction with the ESD implantation of this invention. From the device structure shown in FIG. 17, only the junction CR under the drain contact DC is not covered by this invention ESD implantation, where it has a lowest junction breakdown voltage. During the ESD stress, the junction region with the lowest junction breakdown voltage will be broken first to discharge the ESD current. The ESD current path on such an ESD-implantation NMOS device is shown in FIG. 19.

In FIG. 19, a positive ESD voltage is applied to the pad with the VSS relatively grounded. The drain of the output NMOS is stressed by the ESD voltage and thus breaks down to clamp the overstress voltage on the pad. The region, which is not covered by the ESD implantation of this invention, has a lower junction breakdown voltage. Thus, the ESD current is discharged through this region. The ESD current path in FIG. 19, which is discharged through the parasitic N-P-N BJT in the NMOS device structure, is far away from the surface channel of the output NMOS device. Accordingly, the ESD level of the output NMOS device is effectively improved.

The drain junction breakdown voltage of this ESD-implantation NMOS remains the same as the original drain junction breakdown voltage of the NMOS device having no such ESD implantation. Thus, the leakage current of this ESD-implantation NMOS device used in the 3/5V tolerant I/O circuits (as shown in FIG. 16) is not increased. Moreover, the relative low-breakdown-voltage junction region (the region does not cover with the N region in FIG. 17) is reduced to a smaller area. The leakage current under the high-voltage input bias can even become far smaller. Thus, the ESD implantation method of this invention can concomitantly provide the advantage of improving the ESD robustness of the output NMOS device while providing the additional advantage of reducing the leakage current in the tri-state condition for 3/5V tolerant I/O circuit applications.

As the breakdown location of the drain junction during ESD stress is located at the junction under the drain contact, the ESD current path is far away from the surface channel region. Thus, the layout spacing ($S_{DG}$ in FIG. 8) from the drain contact to the poly gate edge is further reduced to save the total device layout area.

The ESD implantation method of this invention is applied to the output PMOS device to improve its ESD robustness. The ESD implantation on the PMOS device is shown in FIG. 20, where the whole PMOS device is covered by the light doping P region (the region under the P+ diffusion in FIG. 20), except for the junction region under the drain contact. The junction region CR under the drain contact DC having no light doping P region has a lower junction breakdown voltage, thus the ESD current is discharged through this region into the N-well. The ESD current path in this ESD-implantation PMOS device is far away from the surface channel of the PMOS device, so its ESD level is significantly improved. Moreover, the leakage current of this ESD-implantation PMOS device is not increased by this invention ESD implantation method. It is suitable for application in the 3V/5V tolerant I/O circuits.

Moreover, the drain junction which has a lighter doping concentration also has a smaller parasitic drain-to-bulk junction capacitance. In the device structure shown in FIG. 17 for NMOS device (FIG. 20 for PMOS device), the drain region covered by the ESD-implantation with lighter doping N (P) junction has a smaller drain-to-bulk junction capacitance. Only the drain region, which is not covered by the light-doping ESD implantation, has the original drain-to-bulk junction capacitance. However, in the layout as shown in FIG. 18, the drain region which is not covered by the light-doping ESD implantation only has a smaller layout area. Thus, the total drain junction capacitance of the NMOS device in FIG. 17 has a smaller junction capacitance as comparing to the NMOS device without such ESD implantation. Thus, this invention also has a benefit to reduce the drain capacitance, and it is more suitable for high-speed I/O applications.

Modified Design of Invention

The ESD current is mainly discharged through the drain regions of the output NMOS/PMOS device. Thus, the ESD implantation method of this invention is applied only to the drain region of the output NMOS/PMOS device on either side of region CR. Such modified designs are drawn in FIG. 21 for NMOS device 60 with N-well 62 formed in substrate 61 and in FIG. 22 for PMOS device 60' with N-well 62' and P+ source/drain regions S/D and P-doped LD-ESD regions ESD formed in substrate 61. In FIG. 21 (FIG. 22), the NMOS/PMOS devices have different junction structures in the drain/source regions. The LDD peak structure in the source is still maintained but that in the drain region is covered by the LD-ESD implantation ESD of this invention with lighter doping concentration. With such modified design, the ESD robustness is also improved.

This invention is also applied to the Field-Oxide Device (FOD) to improve its ESD robustness. The applications of this invention on the N-type FOD and P-type FOD are illustrated in FIG. 23 and FIG. 24, respectively. The FOD devices 60/60' have a think field oxide region FOX on the channel top of the FOD. The junction region that with the lightly-doping ESD implantation of this invention in the FOD has a higher junction breakdown voltage. However, the junction region CR under the drain contact that without the lightly-doping ESD implantation in the FOD has its original junction breakdown voltage. Thus, while the ESD voltage applied on the FOD, the drain junction region under the drain contact DC that without the lightly-doping ESD implantation in the FOD will be first broken down to generate the triggering current into the substrate. The triggering current in the substrate can forward bias the base-emitter junction of the lateral parasitic N-P-N BJT in the FOD, thus the lateral N-P-N BJT can be earlier turned on to bypass the ESD current.

A similar effect of this invention applies in the P-type FOD to increase ESD Robustness of the P-type FOD in CMOS technologies. An FOD with this modified ESD implantation is applied in the input ESD protection circuit for the 3V/5V tolerant input pin, as shown in FIG. 25. In FIG. 25, the VDD power level of the chip is 3.3V, but the input signal could have a maximum voltage level of 5V. In such a 3V/5V tolerant input pin, the diode connected from the pad to VDD of 3.3V is forbidden. To sustain the 5V input signal, the Mn3 is used to reduce the voltage level to the internal circuits, a resistor $R_{ESD}$ is used to limit the overstress current into the internal circuit, and the FOD1 is used to mainly discharge the ESD current on the pad. The drain junction of this FOD1 is covered by the ESD implantation of this invention with the lightly-doping concentration, except the drain junction region right under the drain contact. Using this invention on the FOD1, the ESD level of FOD1 is improved, and the parasitic junction capacitance of FOD1 is also reduced.

This process of ESD implantation with lightly-doping concentration which increases the junction breakdown voltage of the specially selected junction region is also applied to a diode for ESD protection. The applications of this invention on a diodes 160/160' to improve ESD robustness is shown in FIG. 26 and FIG. 27. In FIG. 26, the diode is realized in the P-well of a CMOS process with the P-type substrate, thus the cathode of the diode is the N+ diffusion junction region which is connected to the pad. In FIG. 27, the diode is realized in the N-well of a CMOS process with the P-type substrate, thus the cathode of the diode is the N+ diffusion junction region which is connected to the pad. The ESD current is coming from the pad, thus the ESD energy is mainly dissipated across the P-N junction of the diode. The edge of the P-N junction closes to the field oxide is the weakest junction of the diode. If this junction location is broken down by the ESD energy, it is often cause a low ESD level of the diode. Thus, in accordance with this invention ESD implantation with lightly-doping concentration is also applied on the diode as those shown in FIG. 26 and FIG. 27 to improve ESD level of the diodes. The junction regions which are covered by this invention ESD implantation with lightly-doping concentration have a higher junction breakdown voltage. Thus, the breakdown location on the diode junction is focused at the junction region that under the contact, which is far away from the weakest junction region around the field oxide edge of the diode. Moreover, the parasitic junction capacitance across the P-N junction is also reduced, because this invention ESD implantation causes a low doping concentration across the P-N junction. This also reduces the input capacitance on the input pad suitable for high-speed input signal.

The application of the diode with the ESD implantation of this invention in the input ESD protection circuit for the 3V/5V tolerant input pin is shown in FIG. 28. In FIG. 28, the VDD power level of the chip is 3.3V, but the input signal could have a maximum voltage level of 5V. In such a 3V/5V tolerant input pin, the Mn3 is used to reduce the voltage level to the internal circuits, a resistor $R_{ESD}$ is used to limit the overstress current into the internal circuit, and the diode D1 is used to mainly discharge the ESD current on the pad. By applying the ESD implantation of this invention with lightly-doping concentration on the diode D1, the parasitic junction capacitance of the diode is reduced and the ESD level of this ESD protection circuit is increased.

Several conclusions may be drawn as indicated below.

Conclusions

A new ESD (Electrostatic Discharge) implantation method of this invention is for application in the high-voltage-tolerant I/O pins in deep-submicron CMOS technology. The ESD discharging current path in the NMOS or PMOS device structure is changed by the ESD-implantation method of this invention, thus the ESD level of the NMOS/PMOS device in the output buffer is improved significantly. In this invention, the ESD-implantation regions are located at the output NMOS or PMOS devices, but without covering the region under the drain contact. The ESD implantation of this invention has a lightly-doping concentration. Thus, the regions with this ESD implantation have a higher junction breakdown voltage and a lower junction capacitance; but, the region under the drain contact without this ESD implantation has an unchanged junction breakdown voltage. Thus, the ESD current is discharged through the junction region under the drain contact to the bulk (substrate). The ESD current is thus discharged far away from the surface channel region of the output NMOS or PMOS device. Thus, the output NMOS device and PMOS device can sustain a far higher ESD level. This invention can be also applied to the Field-Oxide Device (FOD) or diode to change the breakdown location for ESD current dissipation. Thus, it can improve the ESD level of such devices for ESD protection. The junction covered by this ESD implantation of this invention with lightly-doping concentration also has a lower junction capacitance and low leakage current. Thus, this invention is more suitable for application in high voltage tolerant I/O circuits. The low junction capacitance allows the I/O pad to be operated at a higher circuit speed.

Because the breakdown location of the drain junction during ESD stress is located at the junction under the drain contact (the region is not covered by this invention ESD Implantation), the ESD current path is far away from the surface channel region. Thus, the layout spacing from the drain contact to the poly gate edge is further reduced to save the total device layout area.

The drain junction covered by this invention ESD implantation with a lightly-doping concentration has a smaller junction capacitance. This is more suitable for high-speed I/O applications.

The drain junction is covered by the ESD implantation of this invention with a lightly-doping concentration has a lower junction leakage current. This is more suitable for applications in the high-voltage-tolerant I/O circuits.

References Cited Above are Listed as Follows:

References

[1] C.-C. Hsue, "Method of improvement ESD for LDD process," U.S. Pat. No. 5,416,036.
[2] C.-C. Hsue, "Double polysilicon electrostatic discharge protection device for SRAM and DRAM memory devices," U.S. Pat. No. 5,455,444.
[3] Y.-H. Wei et al., "Method of forming an ESD and hot carrier resistant integrated circuit structure," U.S. Pat. No. 5,496,751.
[4] T.-Y. Huang, "Method for making an integrated circuit structure," U.S. Pat. No. 5,529,941.
[5] C.-C. Hsue, "Process for fabrication a semiconductor electrostatic discharge (ESD) protective device," U.S. Pat. No. 5,585,299.
[6] J.-S. Lee, "Method for fabricating an electrostatic discharge protection circuit," U.S. Pat. No. 5,672,527.
[7] P. Gilbert et al., "Process for forming a semiconductor device with ESD protection," U.S. Pat. No. 5,733,794.
[8] C.-C. Hsue et al., "Method for ESD protection improvement," U.S. Pat. No. 5,374,565.
[9] T. A. Lowrey et al. "Static discharge circuit having low breakdown voltage bipolar clamp," U.S. Pat. No. 5,581,104.
[10] K.-Z. Chang et al. "Method of making ESD protection device structure for low supply voltage applications," U.S. Pat. No. 5,674,761.
[11] R.-Y. Shiue et al. "ESD implantation scheme for 0.35 $\mu$m 3.3V 70 Å gate oxide process," U.S. Pat. No. 5,953,601.
[12] S. G. Beebe, "Methodology for layout design and optimization of ESD protection transistors," EOS/ESD Symp. Proc., pp. 265–275, (1996)
[13] S. Daniel and G. Krieger, "Process and design optimization for advanced CMOS I/O ESD protection devices," EOS/ESD Symp. Proc., pp. 206–213, (1990).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:
1. An ESD implantation device comprising:
a patterned stack of a gate conductive layer above a gate dielectric layer formed on a substrate,
lightly doped source/drain (LDD) regions and source/drain regions formed in the substrate including a drain contact,
an ESD implantation with a lightly-doped concentration in the ESD regions of ESD-protection devices comprising ESD regions extending below the source/drain and LDD regions with an ESD implantation doping profile of the ESD implantation is deep enough to cover surfaces of a drain diffusion implantation extending below the source/drain LDD regions within the substrate aside from a central region below the drain contact, and
the ESD implantation is absent below the central region.
2. The device of claim 1 wherein the ESD implantation of a lightly-doped concentration for ESD protection extending below the source/drain LDD regions and source/drain regions is provided in a selected one of an output circuit and an input circuit.
3. An ESD implantation device comprising:
a patterned stack of a gate conductive layer above a gate dielectric layer formed on a substrate,
lightly doped source/drain (LDD) regions and source drain regions formed in the substrate and a drain contact associated with a drain region,
an ESD implantation with a lightly-doped concentration in the ESD regions of ESD-protection devices with the ESD implantation doping profile of the ESD implantation being deep enough to cover surfaces of the drain diffusion implantation within the substrate only aside from a central region below the drain contact, and
the ESD implantation doping profile is absent from the central region directly below the drain contact.
4. The device of claim 1 wherein the ESD implantation had followed a lightly doped source/drain (LDD) implantation and preceded formation of sidewall spacers adjacent to gate electrode stacks of a gate electrode above a gate dielectric layer.
5. The device of claim 1 wherein the device is selected from the group consisting of NMOS, PMOS, field-oxide, and diode devices.
6. The device of claim 1 wherein ESD protection is provided only in the drain region of the ESD protection NMOS/PMOS device.
7. The device of claim 1 wherein ESD protection is provided in the output/input circuits.
8. An ESD implantation CMOS device comprising:
a substrate with a FOX oxide layer which is patterned as FOX regions,
a gate-oxide and gate-polysilicon layer and patterned gate electrode stacks formed on the substrate,
a Lightly Doped Drain (LDD) ion implantation deeper than ultimate depths of source/drain regions in the substrate,
source/drain regions and formed in the substrate, and a drain contact associated with a drain region,
Low-Temperature Oxide sidewall spacers formed on sidewalls of the gate electrode stacks,
diffusion/implanted source/drain regions formed in the substrate aligned with the combination of sidewall spacers and the gate electrode stacks,
diffusion/implanted counterdoped regions formed between the source/drain regions and the FOX regions,
CVD/LTO etched contact holes formed extending down to doped regions in the substrate, and
an ESD implantation with a lightly-doped concentration in the ESD regions of ESD-protection devices with the ESD implantation doping profile of the ESD implantation being deer, enough to cover surfaces of a drain diffusion implantation within the substrate only aside from a central region and is absent directly below the drain contact.

9. The device of claim 8 wherein the ESD implantation had followed a lightly doped source/drain (LDD) implantation and preceded formation of sidewall spacers adjacent to gate electrode stacks of a gate electrode above a gate dielectric layer.

10. The device of claim 8 wherein the device is selected from the group consisting of NMOS, PMOS, field-oxide, and diode devices.

11. The device of claim 8 wherein ESD protection is provided only in the drain region of the ESD-protection NMOS/PMOS device.

12. The device of claim 8 wherein ESD protection is provided in the output/input circuits.

* * * * *

UNITED STATES PATENT AND TRADEMARK OFFICE
CERTIFICATE OF CORRECTION

PATENT NO. : 6,838,734 B2
DATED : January 4, 2005
INVENTOR(S) : Ming Dou Ker, Tung-Yang Chen and Hun-Hsien Chang It is certified that error appears in the above-identified patent and that said Letters Patent is hereby corrected as shown below:

Column 1,
Line 21, delete "methuds" and insert therefor -- methods --;

Column 7,
Line 2, insert -- a -- after the word "invention"; and

Column 16,
Line 64, delete "deer" and insert therefor -- deep --.

Signed and Sealed this

Tenth Day of May, 2005

JON W. DUDAS
*Director of the United States Patent and Trademark Office*